(12) United States Patent
Lin et al.

(10) Patent No.: US 10,490,478 B2
(45) Date of Patent: Nov. 26, 2019

(54) CHIP PACKAGING AND COMPOSITE SYSTEM BOARD

(71) Applicant: Industrial Technology Research Institute, Hsinchu (TW)

(72) Inventors: Yu-Min Lin, Hsinchu County (TW); Kuo-Shu Kao, Hsinchu (TW); Jing-Yao Chang, New Taipei (TW); Tao-Chih Chang, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/647,264

(22) Filed: Jul. 12, 2017

(65) Prior Publication Data
US 2018/0019178 A1    Jan. 18, 2018

Related U.S. Application Data

(60) Provisional application No. 62/360,983, filed on Jul. 12, 2016.

(30) Foreign Application Priority Data

Apr. 18, 2017    (TW) .............................. 106112866 A

(51) Int. Cl.
*H01L 21/00*    (2006.01)
*H01L 23/367*    (2006.01)
(Continued)

(52) U.S. Cl.
CPC .......... *H01L 23/367* (2013.01); *H01L 21/565* (2013.01); *H01L 23/13* (2013.01);
(Continued)

(58) Field of Classification Search
CPC ............... H01L 23/5389; H01L 23/492; H01L 23/3121; H01L 23/36; H01L 24/20;
(Continued)

(56) References Cited

U.S. PATENT DOCUMENTS 6,437,433 B1 *   8/2002   Ross ................... H01L 25/0657
                                                257/692
7,843,052 B1 *   11/2010  Yoo ....................... H01L 21/561
                                                257/686

(Continued)

FOREIGN PATENT DOCUMENTS

CN    102208498    10/2011
TW    200707683    2/2007
(Continued)

OTHER PUBLICATIONS

"Office Action of Taiwan Counterpart Application", dated May 8, 2018, p. 1-p. 7.

*Primary Examiner* — Richard A Booth
(74) *Attorney, Agent, or Firm* — JCIPRNET

(57) ABSTRACT

A chip packaging includes a substrate, a first chip, a molding material, a first circuit, and a second circuit. The substrate includes a bottom surface, a first top surface disposed above the bottom surface with a first height, and a second top surface disposed above the bottom surface with a second height. The first height is smaller than the second height. The first chip is disposed on the first top surface. The molding material is disposed on the substrate and covers the first chip. The first and second circuits are disposed on the molding material, and are respectively and electrically connected to the first chip and the second top surface of the substrate. The substrate is made of copper material with huge area and has the properties of high current withstand capacity and high thermal efficiency. The second top surface protects the first chip from damage.

29 Claims, 35 Drawing Sheets

(51) Int. Cl.
  *H05K 1/02* (2006.01)
  *H01L 23/31* (2006.01)
  *H01L 23/13* (2006.01)
  *H05K 3/32* (2006.01)
  *H05K 1/11* (2006.01)
  *H01L 23/00* (2006.01)
  *H01L 25/065* (2006.01)
  *H01L 21/56* (2006.01)
  *H01L 23/492* (2006.01)
  *H01L 23/373* (2006.01)
  *H01L 23/36* (2006.01)
  *H01L 23/538* (2006.01)
  *H05K 3/46* (2006.01)
  *H05K 1/18* (2006.01)
  *H05K 3/00* (2006.01)
  *H01L 25/10* (2006.01)
  *H01L 21/48* (2006.01)
  *H05K 3/10* (2006.01)

(52) U.S. Cl.
  CPC .......... *H01L 23/3121* (2013.01); *H01L 23/36* (2013.01); *H01L 23/3735* (2013.01); *H01L 23/492* (2013.01); *H01L 23/5389* (2013.01); *H01L 24/19* (2013.01); *H01L 24/20* (2013.01); *H01L 24/32* (2013.01); *H01L 24/73* (2013.01); *H01L 25/0655* (2013.01); *H05K 1/0204* (2013.01); *H05K 1/115* (2013.01); *H05K 3/32* (2013.01); *H05K 3/4688* (2013.01); *H01L 21/4857* (2013.01); *H01L 23/5385* (2013.01); *H01L 24/83* (2013.01); *H01L 25/105* (2013.01); *H01L 2224/04105* (2013.01); *H01L 2224/18* (2013.01); *H01L 2224/211* (2013.01); *H01L 2224/215* (2013.01); *H01L 2224/24137* (2013.01); *H01L 2224/24247* (2013.01); *H01L 2224/32225* (2013.01); *H01L 2224/32245* (2013.01); *H01L 2224/73267* (2013.01); *H01L 2224/838* (2013.01); *H01L 2224/83192* (2013.01); *H01L 2225/1023* (2013.01); *H01L 2225/1094* (2013.01); *H01L 2924/01029* (2013.01); *H01L 2924/15153* (2013.01); *H01L 2924/35* (2013.01); *H01L 2924/37001* (2013.01); *H05K 1/0203* (2013.01); *H05K 1/185* (2013.01); *H05K 3/0047* (2013.01); *H05K 3/108* (2013.01); *H05K 2201/066* (2013.01); *H05K 2201/09827* (2013.01); *H05K 2201/10416* (2013.01)

(58) Field of Classification Search
  CPC ..... H01L 24/32; H01L 24/73; H01L 23/3735; H01L 21/565; H01L 23/367; H01L 23/13
  See application file for complete search history.

(56) References Cited

U.S. PATENT DOCUMENTS

| 7,928,553 | B2 | 4/2011 | Otremba et al. |
| 8,617,927 | B1 | 12/2013 | Margomenos et al. |
| 8,664,043 | B2 | 3/2014 | Ewe et al. |
| 2013/0130439 | A1 | 5/2013 | Hopper |
| 2016/0020194 | A1 | 1/2016 | Gottwald et al. |

FOREIGN PATENT DOCUMENTS

| TW | 200717728 | 5/2007 |
| TW | 201232723 | 8/2012 |
| TW | 201611669 | 3/2016 |

* cited by examiner

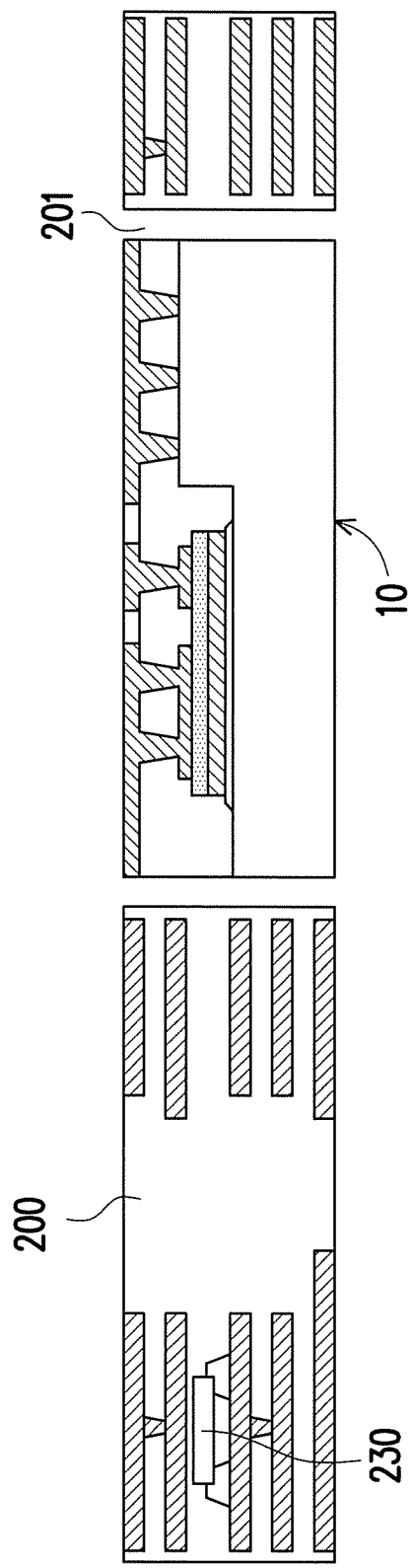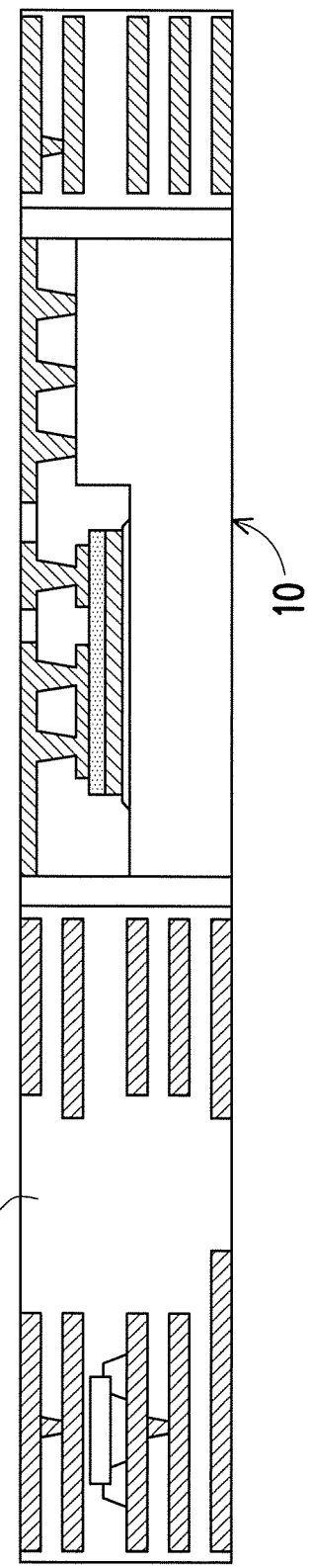

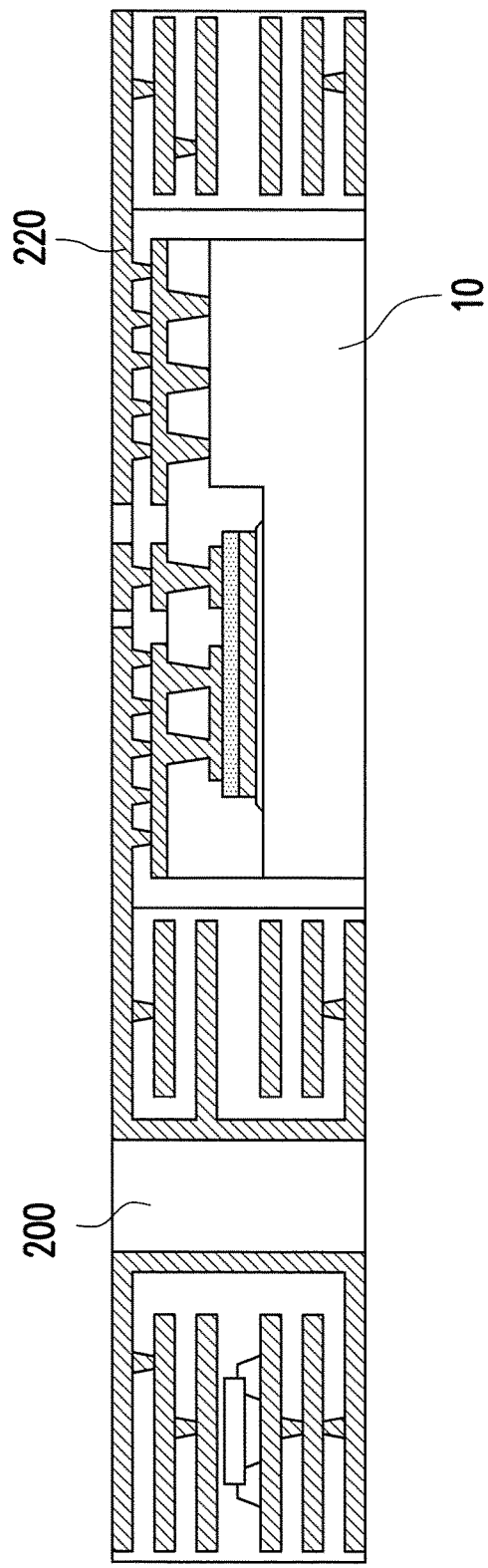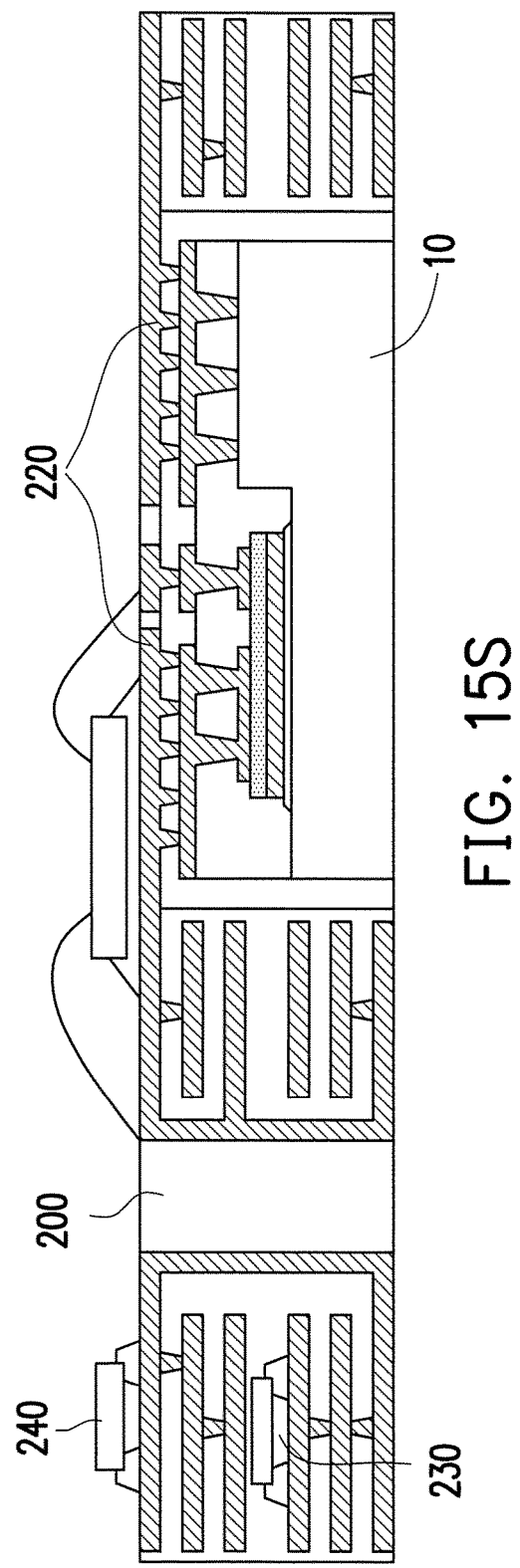

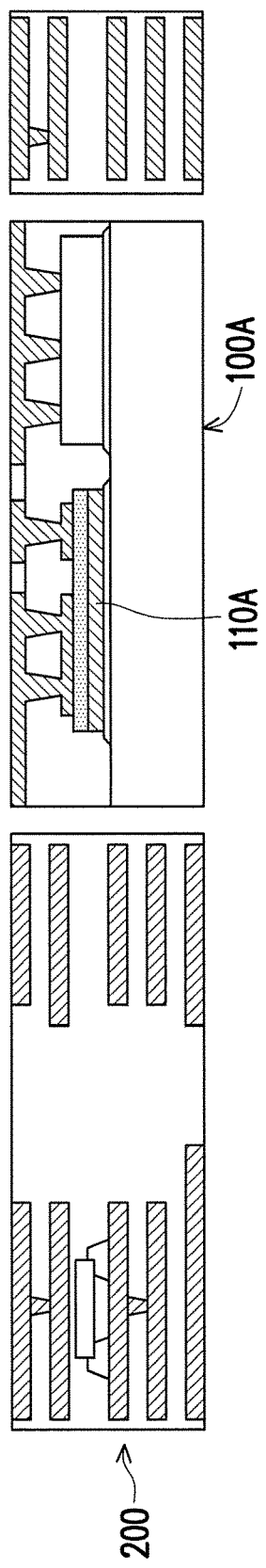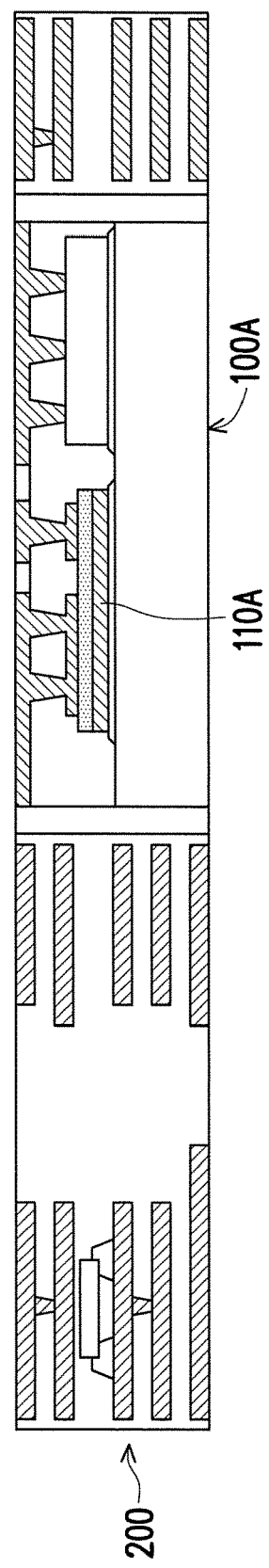

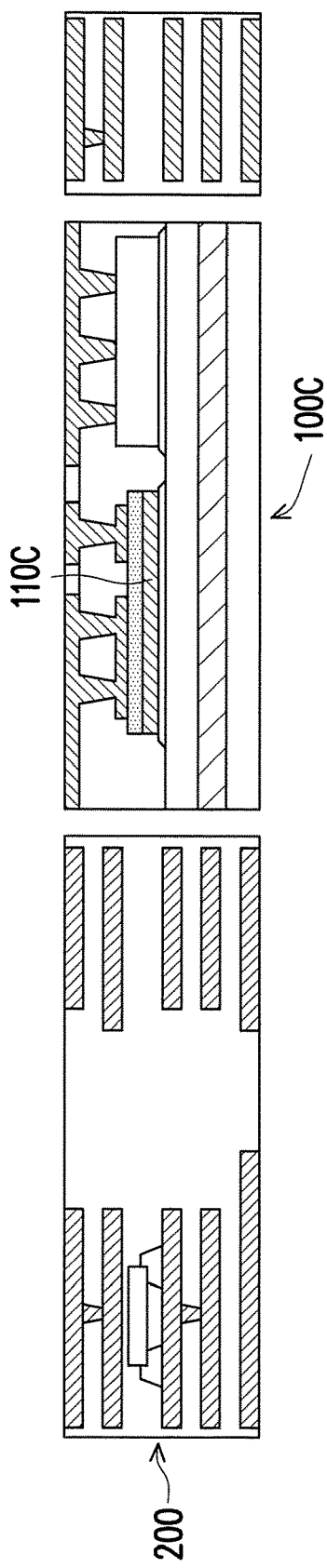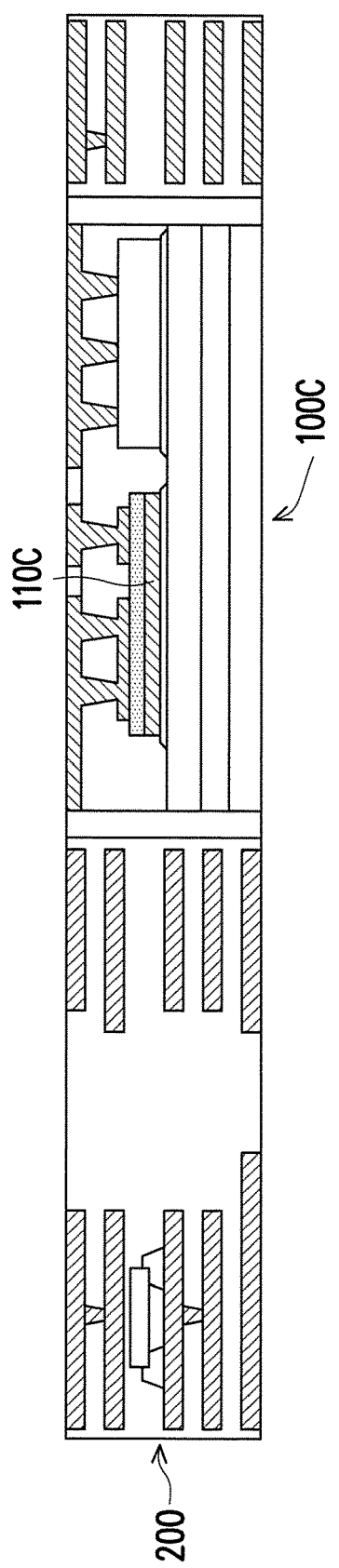

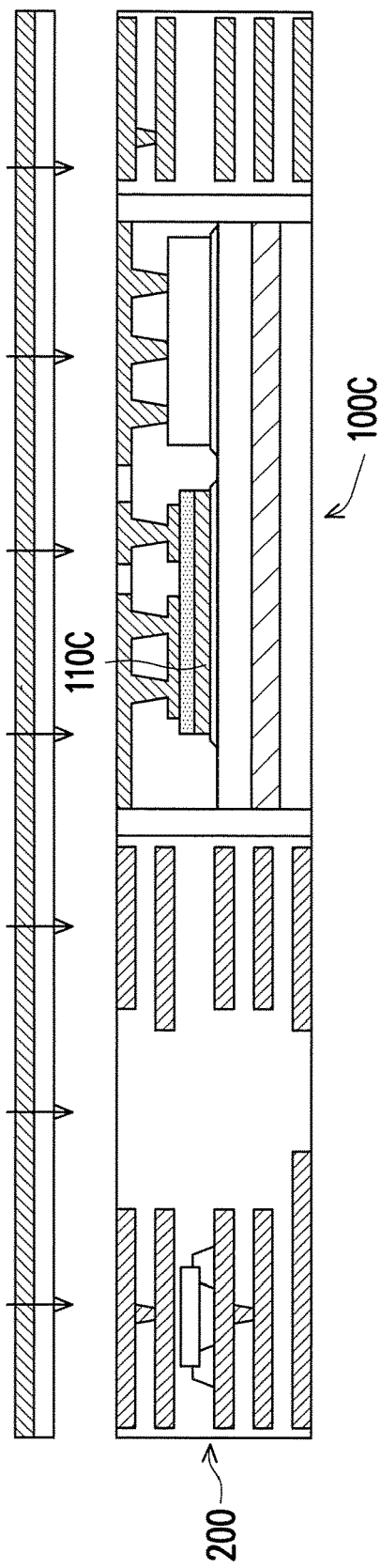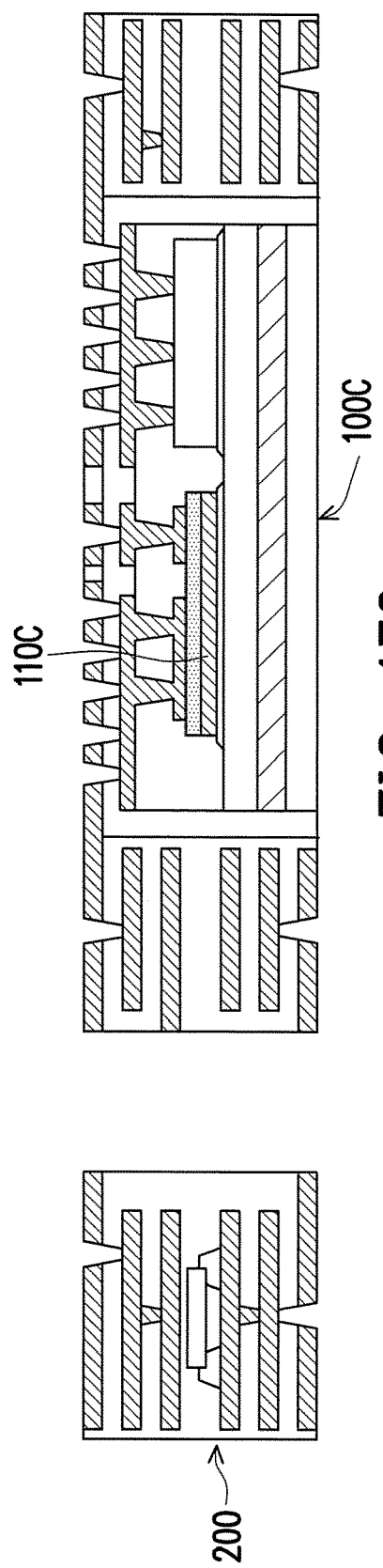

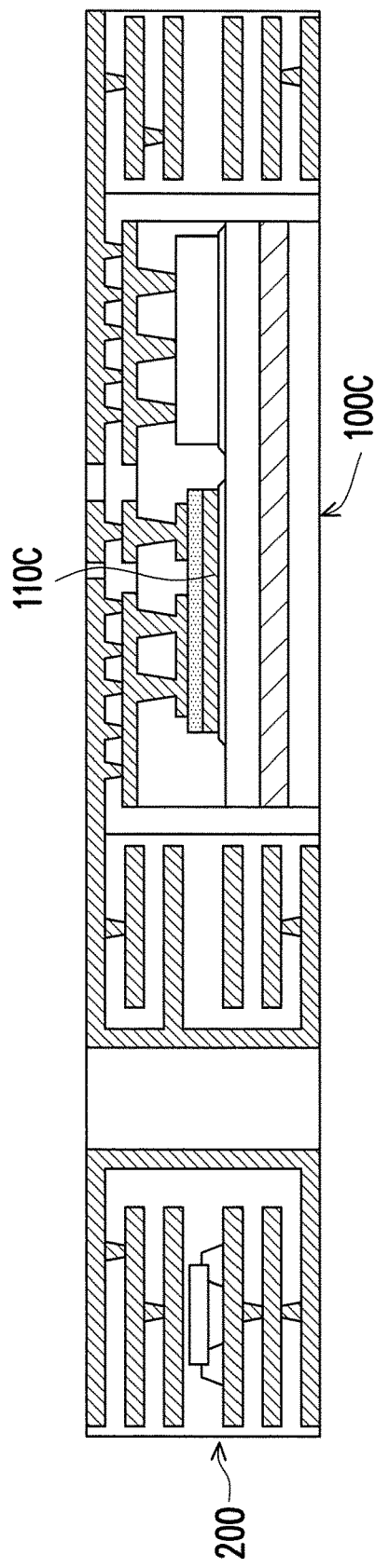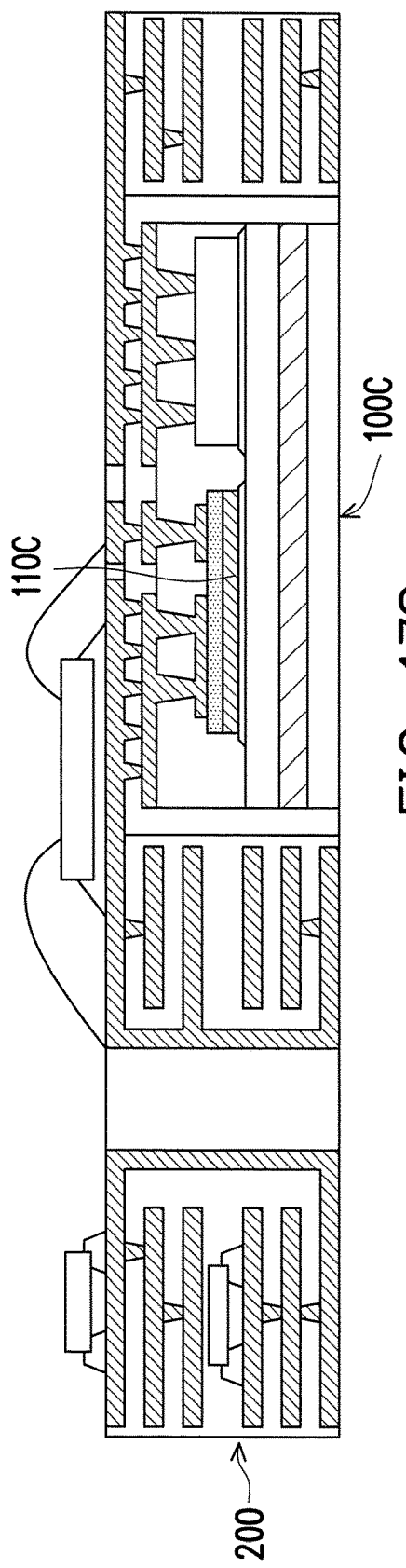

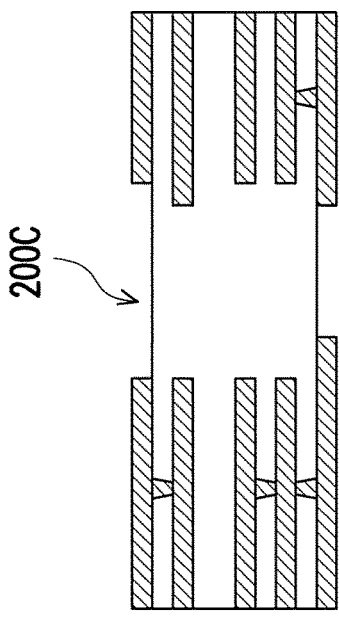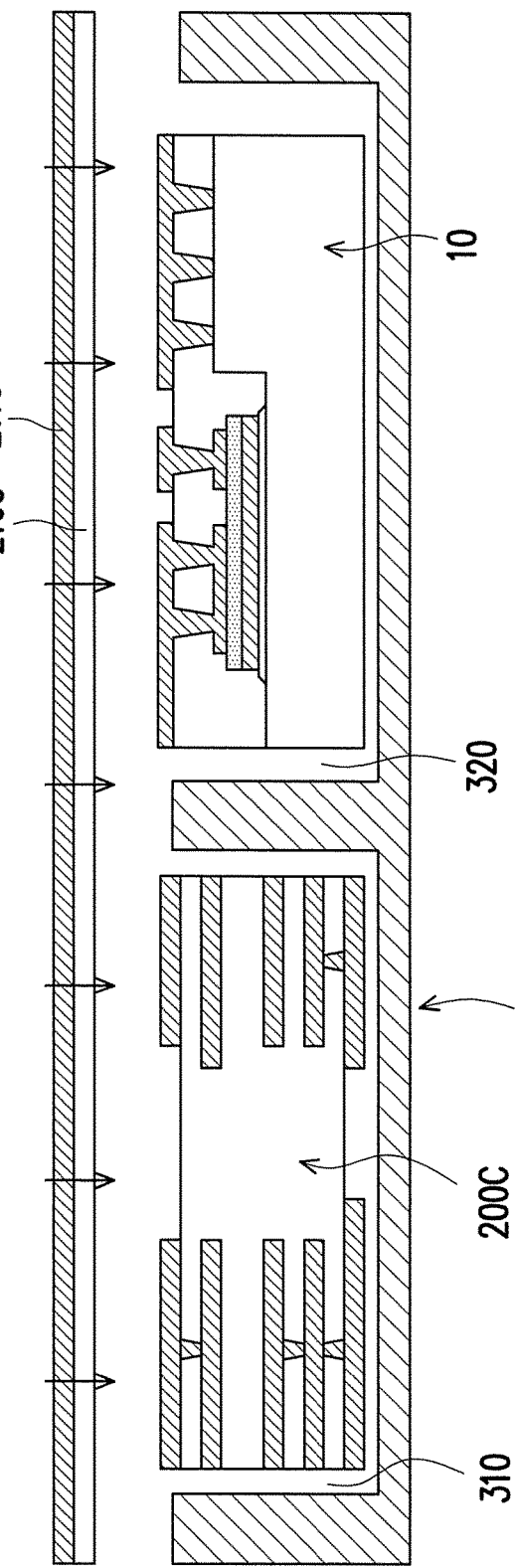
FIG. 18A
FIG. 18B

CHIP PACKAGING AND COMPOSITE SYSTEM BOARD

CROSS-REFERENCE TO RELATED APPLICATION

This application claims the priority benefits of U.S. provisional application Ser. No. 62/360,983, filed on Jul. 12, 2016 and Taiwan application serial no. 106112866, filed on Apr. 18, 2017. The entirety of each of the above-mentioned patent applications is hereby incorporated by reference herein and made a part of this specification.

BACKGROUND

Technical Field

The technical field relates to a chip packaging structure, and more particularly, to a composite system board capable of being mounted with the chip packaging structure.

Background

In traditional process, a drive system chip and a power module chip in an electric motor are fabricated separately, and the two chip products are assembled on a circuit board. In order to pursue the goal of miniaturization, a process technology of combining the drive system chip and the power module chip into an intelligent power module (IPM) has been developed, so as to reduce the structural volume and to simplify the process. Today's semiconductor components adopt various types of packaging based on the process requirements, such as: dual in-line packaging (DIP), thin small outline packaging (TSOP), quad-flat no-leads (QFN) packaging, and so forth. The aforementioned various types of packaging typically adopt wiring bonding technology of metal wire to combine a chip with a lead frame so as to enable the chip to be connected with an external circuit. Finally, a protective layer covering on the outside of the structure is then formed using a molding compound. Nevertheless, the aforementioned packaging structure is poor in heat dissipation efficiency, and thus the applicable specification of the resulting electric motor product is limited.

SUMMARY

The disclosure is related to a chip packaging which has specifications of high heat dissipation efficiency and high power withstand capacity. In addition, a substrate of the chip packaging can protect a chip from being damaged during a press-fitting process.

The disclosure is related to composite system board which has modularizable characteristics and can be process integrated with a panel-level circuit board, and thus is more flexible in terms of the production and manufacturing.

The chip packaging of the disclosure includes a substrate, a first chip, a molding material, a first circuit, and a second circuit. The substrate has a bottom surface and a first top surface and a second top surface opposite to the bottom surface, wherein the first top surface is disposed above the bottom surface with a first height, the second top surface is disposed above the bottom surface with a second height, and the first height is smaller than the second height. The first chip is disposed on the first top surface, and the first chip has a first top electrode. The molding material is disposed on the substrate and covers the first chip, the first top surface and the second top surface. The first circuit is disposed on the molding material and passes through the molding material to electrically connect to the first top electrode. The second circuit is disposed on the molding material and passes through the molding material to electrically connect to the second top surface of the substrate.

The composite system board of the disclosure includes a multilayer circuit board, which has a containing hole, a chip packaging, a first dielectric layer and a third circuit. The chip packaging is disposed in the containing hole, and the chip packaging includes a substrate, a first chip, a molding material, a first circuit, and a second circuit. The substrate has a bottom surface and a first top surface and a second top surface opposite to the bottom surface, wherein the first top surface is disposed above the bottom surface with a first height, the second top surface is disposed above the bottom surface with a second height, and the first height is smaller than the second height. The first chip is disposed on the first top surface, and the first chip has a first top electrode. The molding material is disposed on the substrate and covers the first chip, the first top surface and the second top surface. The first circuit is disposed on the molding material and passes through molding material to electrically connect to the first top electrode. The second circuit is disposed on the molding material and passes through the molding material to electrically connect to the second top surface of the substrate. The first dielectric layer covers the chip packaging and the multilayer circuit board. The third circuit is disposed on the first dielectric layer and passes through the first dielectric layer to electrically connect to the first circuit or the second circuit.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 18A to FIG. 18D are schematic diagrams illustrating the structure composition of a composite system board according to another embodiment of the disclosure.

DETAILED DESCRIPTION OF DISCLOSED EMBODIMENTS

Figure 1:
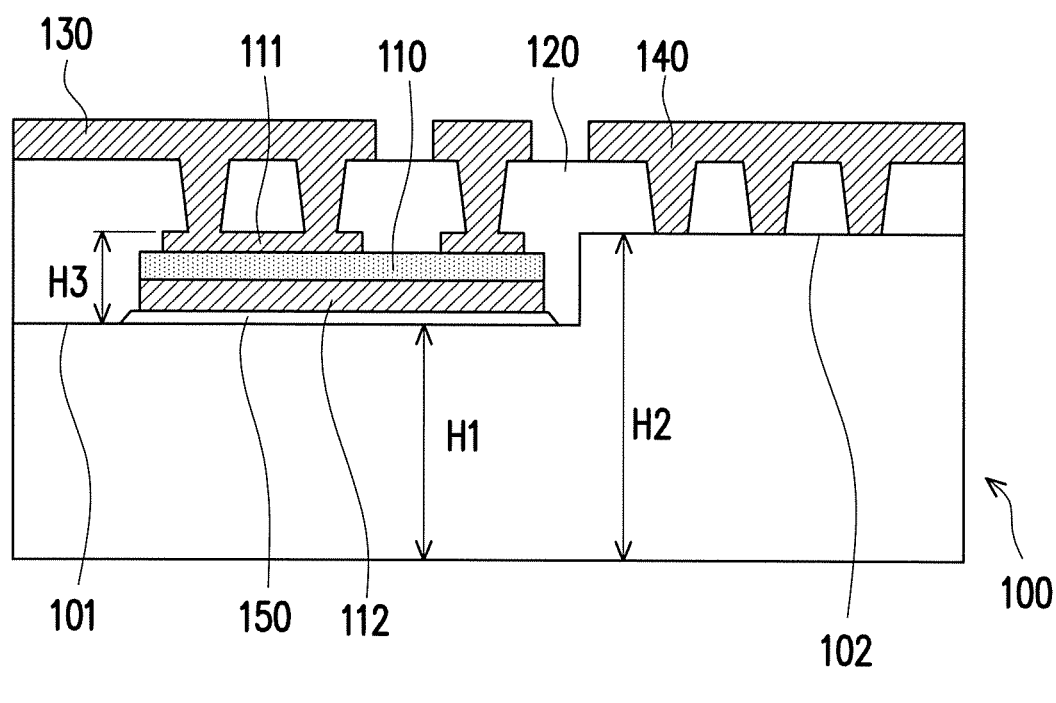
FIG. 1 is a schematic diagram illustrating a chip packaging according to an embodiment of the disclosure.

FIG. 1 is a schematic diagram illustrating a chip packaging according to an embodiment of the disclosure. As shown in FIG. 1, the chip packaging 10 of the present embodiment includes a substrate 100, a first chip 110, a molding material 120, a first circuit 130, and a second circuit 140. The substrate 100 has a first top surface 101 and a second top surface 102. The first chip 110 is disposed on the substrate 100 and has first top electrode 111. The molding material 120 is disposed on the substrate 100 and covers the first chip 110. The first circuit 130 is disposed on the molding material 120 and passes through the molding material 120 to electrically connect to the first top electrode 111. The second circuit 140 is disposed on the molding material 120 and passes through the molding material 120 to electrically connect to the second top surface 102 of the substrate 100. In the present embodiment, the quantity of the first chip 110 may be one or plural. The substrate 100 is a conductive material, such as a copper material with huge area.

In the present embodiment, the first top surface 101 and the second top surface 102 of the substrate 100 are located at a side opposite to a bottom surface of the substrate 100. The first top surface 101 is disposed above the bottom surface with a first height H1, the second top surface 102 is disposed above the bottom surface with a second height H2, and the first height H1 is smaller than a second height H2. In addition, the bottom of the first chip 110 further includes a bottom electrode 112. The bottom electrode 112 is electrically connected to the first top surface 101 of the substrate 100, and the first chip 110 is, for example, an analog chip configured to process a voltage or current signal. In the present embodiment, the first chip 110 is disposed on the first top surface 101, and the first height H1 of the first top surface 101 in addition with a third height H3 at where the first chip 110 is disposed above the first top surface 101 equals to the second height H2 of the second top surface 102 of the substrate 100. In other embodiments, the first height H1 of the first top surface 101 in addition with the third height H3 at where the first chip 110 is disposed above the first top surface 101 may be smaller than the second height H2 of the second top surface 102 of the substrate 100.

As shown in FIG. 1, the chip packaging 10 of the present embodiment further includes a first conductive adhesive layer 150, which is disposed between the first chip 110 and the first top surface 101 of the substrate 100. The first conductive adhesive layer 150 is, for example, a nano silver paste or a nano copper paste. In general, the first conductive adhesive layer 150 may be disposed on the first top surface 101 of the substrate 100 by means of coating process. Otherwise, the first conductive adhesive layer 150 may be a conductive structure formed on the first top surface 101 by means of electroplating process.

Figure 2A:
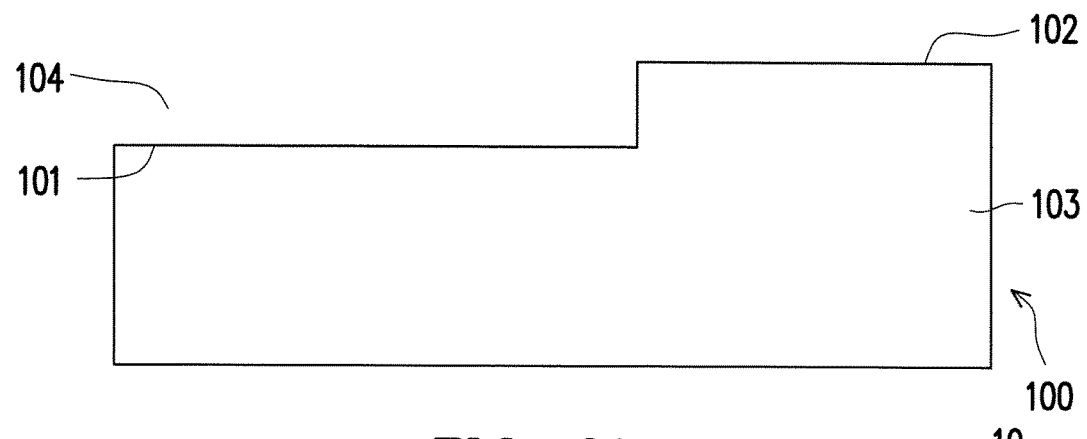
FIG. 2A to FIG. 2C are schematic diagrams illustrating the structure composition of the chip packaging of FIG. 1.
Figure 2B:
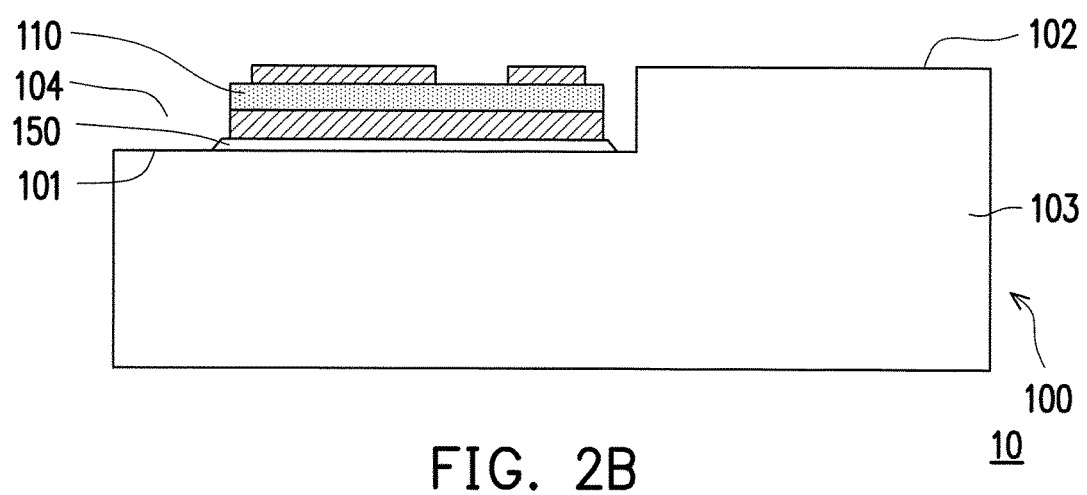
Figure 2C:
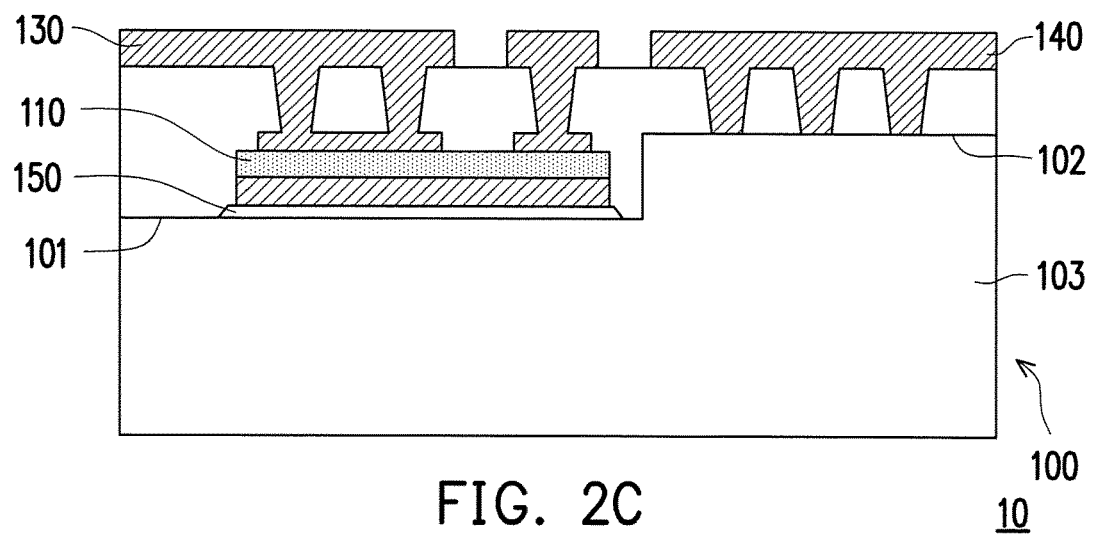

FIG. 2A to FIG. 2C are schematic diagrams illustrating the structure composition of the chip packaging of FIG. 1. Referring to FIG. 2A, the substrate 100 includes an integrally formed conductor block 103. Specifically, the conductor block 103 is, for example, a L-shaped structure having a depression 104 on the top thereof, the first top surface 101 of the substrate 100 is located at the bottom of the depression 104, and the second top surface 102 of the substrate 100 is located outside of the depression 104. Referring to FIG. 2B, the first chip 110 is disposed in the depression 104 and not higher than the second top surface 102 of the substrate 100. Referring to FIG. 2C, in the conductor block 103 which is the L-shaped structure, the first circuit 130 is electrically connected to the first chip 110, and the second circuit 140 is electrically connected to the second top surface 102 of the substrate 100.

Figure 3:
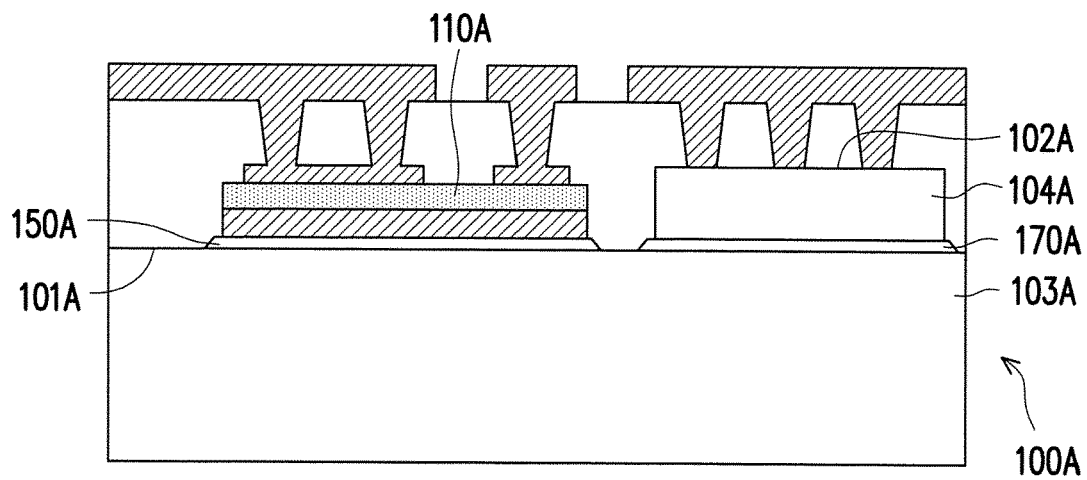
FIG. 3 is a schematic diagram illustrating a chip packaging according to an embodiment of the disclosure.

FIG. 3 is a schematic diagram illustrating a chip packaging according to an embodiment of the disclosure. As shown in FIG. 3, a substrate 100A of the present embodiment includes an integrally formed first conductor block 103A and an integrally formed second conductor block 104A. A first top surface 101A of the substrate 100A is disposed at the top of the first conductor block 103A. The second conductor block 104A is disposed at the top of the first conductor block 103A, and a second top surface 102A of the substrate 100A is located at the top of the second conductor block 104A.

In addition, the present embodiment further includes a second conductive adhesive layer 170A, and the second conductive adhesive layer 170A is disposed between the second conductor block 104A and the first conductor block 103A. The second conductive adhesive layer 170A is a nano silver paste or a nano copper paste. In general, the second conductive adhesive layer 170A may be disposed on a top surface of the first conductor block 103A or a bottom surface of the second conductor block 104A by means of coating process. Otherwise, the second conductive adhesive layer 170A may be a conductive structure formed on the first conductor block 103A by means of electroplating process.

Figure 4:
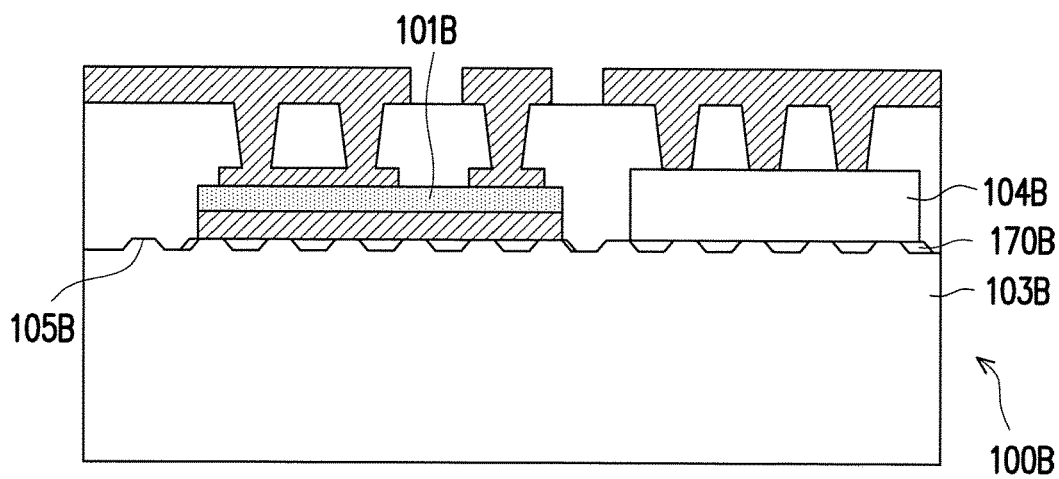
FIG. 4 is a schematic diagram illustrating a chip packaging according to an embodiment of the disclosure.

FIG. 4 is a schematic diagram illustrating a chip packaging according to an embodiment of the disclosure. Referring to FIG. 4, a substrate 100B of the present embodiment includes an integrally formed first conductor block 103B and an integrally formed second conductor block 104B. The first conductor block 103B further has a texture structure 105B. The texture structure 105B is disposed at the top of the first conductor block 103B, and the texture structure 105B is configured to increase a bonding strength of disposing the second conductive adhesive layer 170B on the first conductor block 103A. In the present embodiment, the second conductive adhesive layer 170B may be disposed on the first conductor block 103A by adopting a sintering method.

Figure 5:
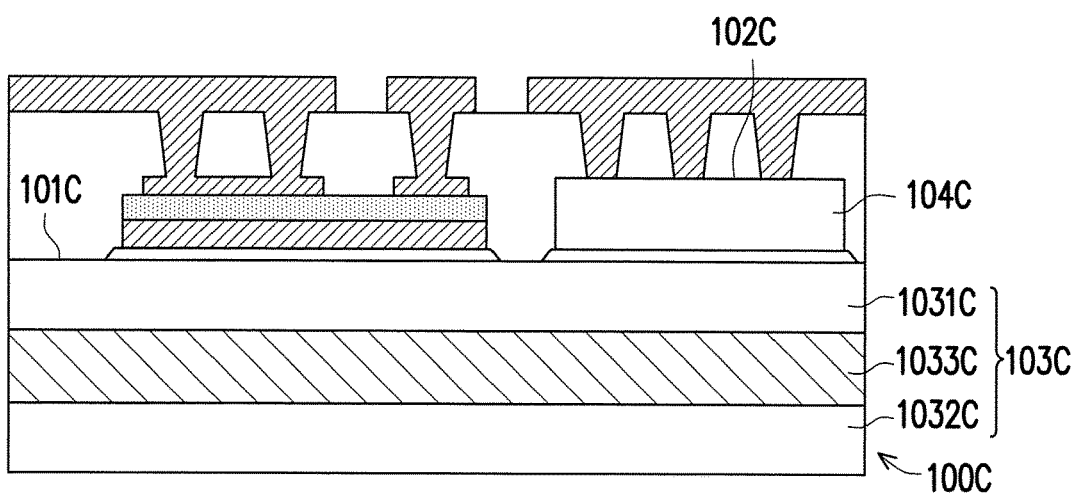
FIG. 5 is a schematic diagram illustrating a chip packaging according to an embodiment of the disclosure.

FIG. 5 is a schematic diagram illustrating a chip packaging according to an embodiment of the disclosure. Referring to FIG. 5, a substrate 100C of the present embodiment includes a multilayer board 103C and an integrally formed conductor block 104C. The multilayer board 103C has a first conductive layer 1031C, a second conductive layer 1032C and a dielectric layer 1033C. A first top surface 101C of the substrate 100C is located on the first conductive layer 1031C. The conductor block 104C is disposed on the first conductive layer 1031C so as to form a L-shaped structure, and a second top surface 102C of the substrate 100C is located at the top of the conductor block 104C. The second conductive layer 1032C is disposed at intervals under the first conductive layer 1031C. The dielectric layer 1033C is disposed between the first conductive layer 1031C and the second conductive layer 1032C. In the present embodiment, the dielectric layer 1033C is connected to the first conductive layer 1031C and second conductive layer 1032C through bonding, sintering or other appropriate means. In addition, the dielectric layer 1033C of the present embodiment is, for example, a material with high heat dissipation efficiency and non-conductivity. When the dielectric layer 1033C is disposed at the multilayer board 103C, the heat dissipation efficiency of the chip packaging can be enhanced, and the first conductive layer 1031C and the second conductive layer 1032C can be prevented from mutual conduction.

Figure 6A:
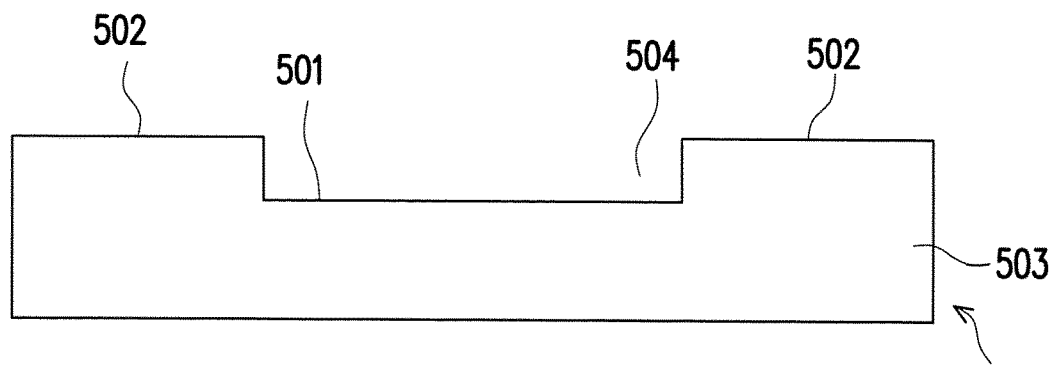
FIG. 6A to FIG. 6C are schematic diagrams illustrating the structure composition of a chip packaging according to another embodiment of the disclosure.
Figure 6B:
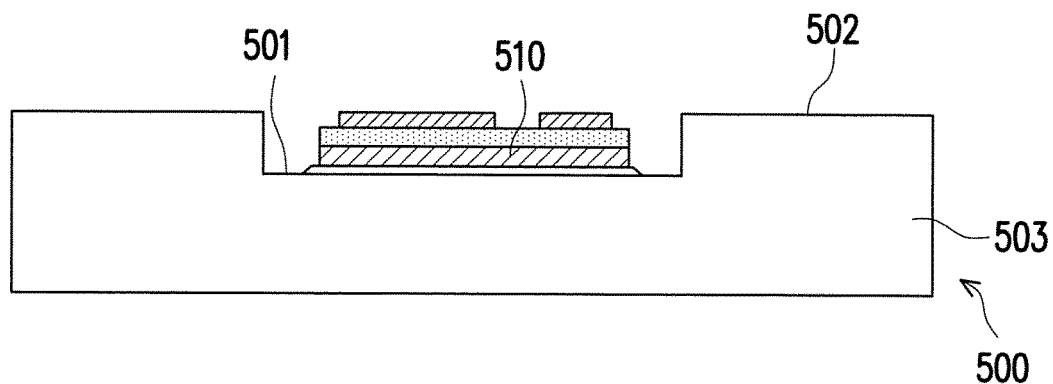
Figure 6C:
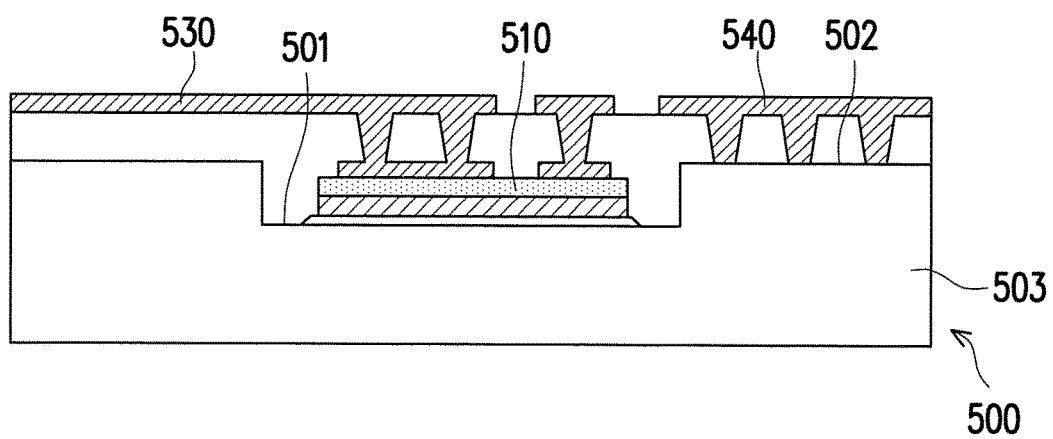

FIG. 6A to FIG. 6C are schematic diagrams illustrating the structure composition of a chip packaging according to another embodiment of the disclosure. Referring to FIG. 6A, a substrate 500 of the present embodiment includes an integrally formed conductor block 503. Specifically, the conductor block 503 is, for example, a concave structure, and the top of the conductor block 503 has a depression 504. A first top surface 501 of the substrate 500 is located at the bottom of the depression 504, and two sides of the depression 504 are each being formed with a convex structure. Second top surfaces 502 of the substrate 500 are respectively located at the top of the two convex structures. Referring to FIG. 6B, a first chip 510 is disposed in the depression 504 and located between the two convex structures, and the first chip 510 does not exceeds the second top surfaces 502 of the substrate 500. As shown in FIG. 6C, in the present embodiment, a first circuit 530 of the chip packaging is electrically connected to the first chip 510 and located on one of the second top surfaces 502, and a second circuit 540 of the chip packaging is electrically connected to the other second top surfaces 502 of the substrate 500.

Figure 7:
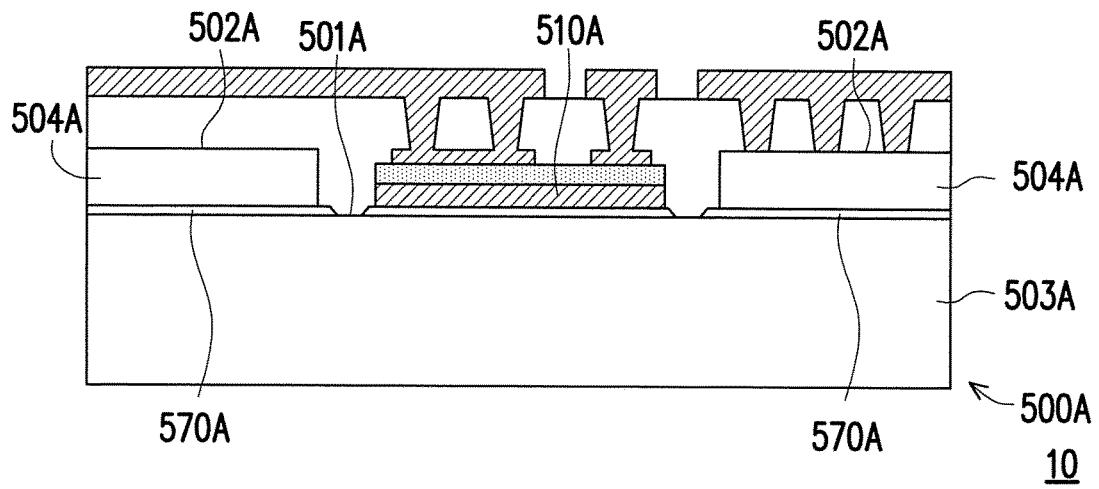
FIG. 7 is a schematic diagram illustrating a chip packaging according to another embodiment of the disclosure.

FIG. 7 is a schematic diagram illustrating a chip packaging according to another embodiment of the disclosure. Referring to FIG. 7, a substrate 500A of the present embodiment includes an integrally formed first conductor block 503A and two integrally formed second conductor blocks 504A. A first top surface 501A of the substrate 500A is located at the top of the first conductor block 503A. The two second conductor blocks 504A are disposed on the top of the first conductor block 503A, and two second top surfaces 502A of the substrate 500A are located at the top of the two second conductor blocks 504A. A second conductive adhesive layer 570A is disposed between the two second conductor blocks 504A and the first conductor block 503A. The second conductive adhesive layer 570A of the present embodiment is a nano silver paste or a nano copper paste. In general, the second conductive adhesive layer 570A may be disposed on a top surface of the first conductor block 503A or on bottom surfaces of the second conductor blocks 504A by means of coating process. Otherwise, the second conductive adhesive layer 570A may be a conductive structure formed on the first conductor block 503A by means of electroplating process.

Figure 8:
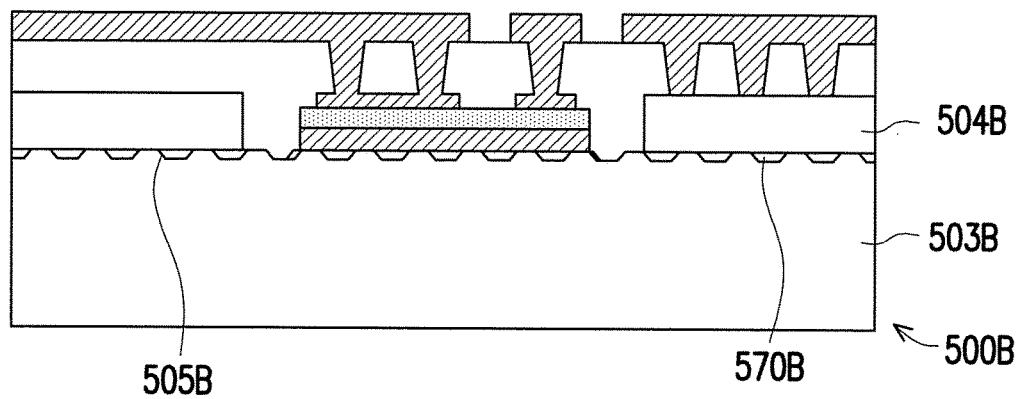
FIG. 8 is a schematic diagram illustrating a chip packaging according to another embodiment of the disclosure.

FIG. 8 is a schematic diagram illustrating a chip packaging according to another embodiment of the disclosure. Referring to FIG. 8, a substrate 500B of the present embodiment includes an integrally formed first conductor block 503B and two second conductor blocks 504B. The first conductor block 503B further has a texture structure 505B. The texture structure 505B is formed on the top of the first conductor block 503B, and the texture structure 505B is configured to increase a bonding strength of sintering a second conductive adhesive layer 570B on the first conductor block 503B. In the present embodiment, the second conductive adhesive layer 570B may be disposed on the first conductor block 503A by adopting the sintering method.

Figure 9:
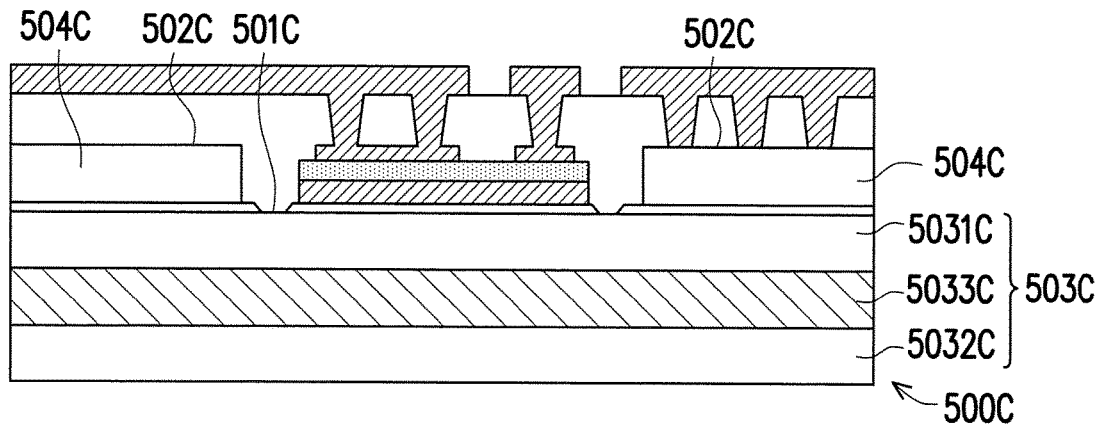
FIG. 9 is a schematic diagram illustrating a chip packaging according to another embodiment of the disclosure.

FIG. 9 is a schematic diagram illustrating a chip packaging according to another embodiment of the disclosure. Referring to FIG. 9, a substrate 500C of the present embodiment includes a multilayer board 503C and two conductor blocks 504C. The multilayer board 503C has a first conductive layer 5031C, a second conductive layer 5032C and a dielectric layer 5033C. A first top surface 501C of the substrate 500C is located on the first conductive layer 5031C. The two conductor blocks 504C are disposed at intervals on the first conductive layer 5031C so as to form a concave structure, and a second top surface 502C of the substrate 500C is located at the top of the conductor block 504C. The second conductive layer 5032C is disposed at intervals under the first conductive layer 5031C. The dielectric layer 5033C is disposed between the first conductive layer 5031C and the second conductive layer 5032C. In the present embodiment, the dielectric layer 5033C is connected to the first conductive layer 5031C and the second conductive layer 5032C through bonding, sintering or other appropriate means. In addition, the dielectric layer 5033C of the present embodiment is a material with high heat dissipation efficiency and non-conductivity. When the dielectric layer 5033C is disposed at the multilayer board 503C, a heat dissipation effect of the chip packaging can be enhanced, and the first conductive layer 5031C and the second conductive layer 5032C can be prevented from mutual conduction.

Figure 10:
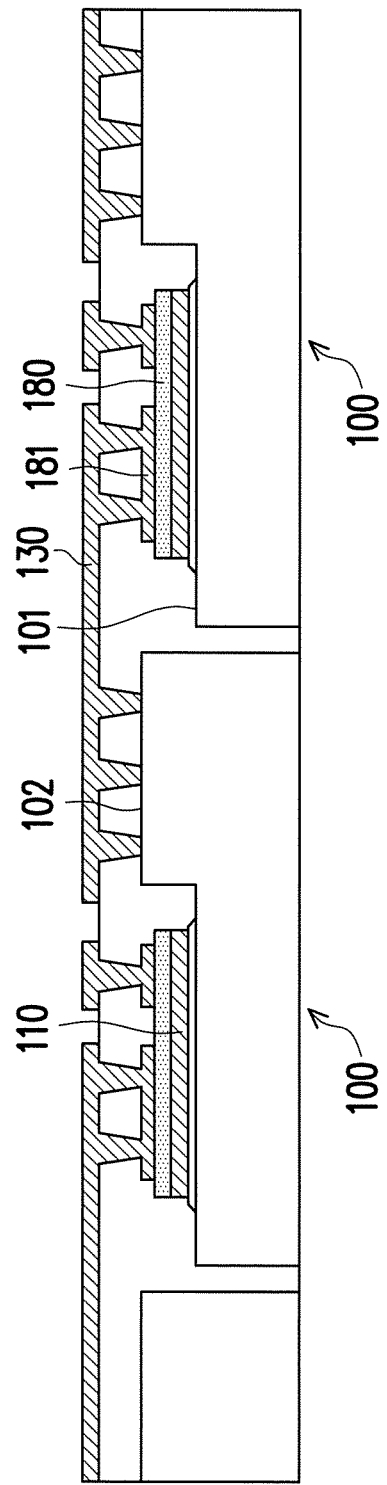
FIG. 10 is a schematic diagram illustrating a chip packaging according to other embodiment of the disclosure.

FIG. 10 is a schematic diagram illustrating a chip packaging according to other embodiment of the disclosure. Referring FIG. 10, the present embodiment, for example, adopts the substrate 100 as shown in FIG. 2A. In the present embodiment, the quantity of the substrate 100 is two, and the chip packaging 10 further includes a second chip 180. The first chip 110 is disposed on the first top surface 101 of one of the substrates 100. The second chip 180 is disposed on the first top surface 101 of the other substrate 100. The second chip 180 has a second top electrode 181. The second top electrode 181 of the second chip 180, through the first circuit 130, is electrically connected to the second top surface 102 of the substrate 100 that is disposed with the first chip 110, so as to be electrically connected to the first chip 110.

Figure 11:
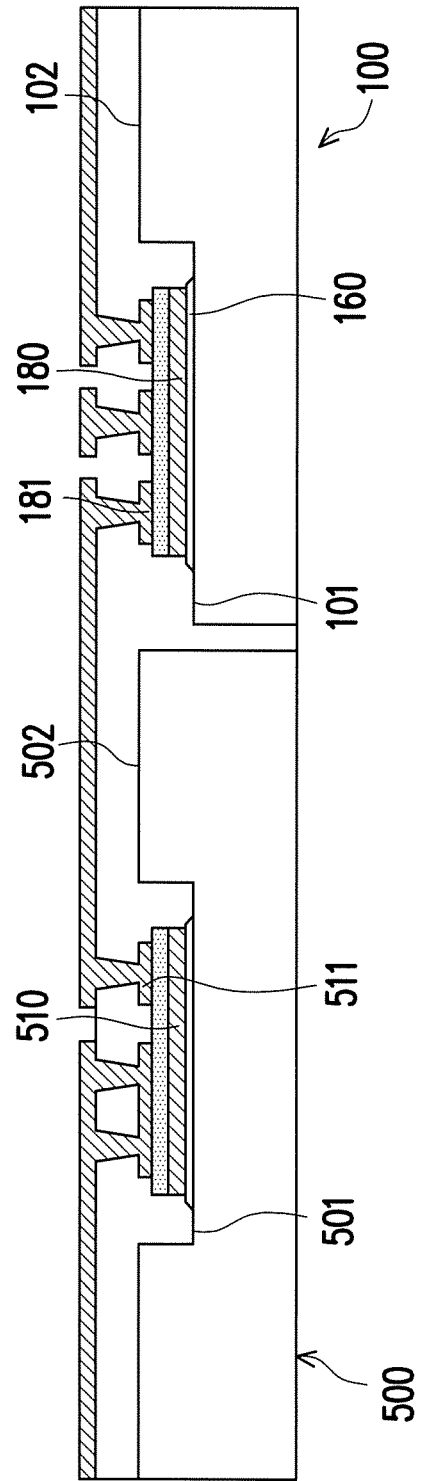
FIG. 11 is a schematic diagram illustrating a chip packaging according to other embodiment of the disclosure.

FIG. 11 is a schematic diagram illustrating a chip packaging according to other embodiment of the disclosure. Referring to FIG. 11, the present embodiment adopts the substrate 100 and the substrate 500 as shown in FIG. 2A and FIG. 6A. In the present embodiment, the chip packaging includes the substrate 100, the substrate 500, the first chip 510, and the second chip 180. The first chip 510 is disposed on the first top surface 501 of the substrate 500, and the second chip 180 is disposed on the first top surface 101 of the substrate 100. The second chip 180 has the second top electrode 181. The second top electrode 181 of the second chip 180 is electrically connected to the first top electrode 511 of the first chip 510 through the first circuit 130, so as to be electrically connected to the first chip 510. The second chip 180 of the present embodiment is, for example a digital chip configured to process a digital logic signal.

In the two embodiments shown in FIG. 10 and FIG. 11, the quantity of the substrate 100 or 500 may be one or plural. The first chip 110 or 510 and the second chip 180 are disposed on the same substrate 100 or 500, or disposed on the different substrates 100 and 500. In the aforementioned two embodiments, the first chip and the second chip may respectively be a digital chip and an analog chip. In addition, the quantity of the first chip and the quantity of the second chip are respectively not limited to one; that is, there may be a plurality of first chips, a plurality of second chips or a plurality of first chips and a plurality of second chips disposed on a same substrate, simultaneously. In other embodiments, different substrates may also be combined into one and be mounted with a plurality of first chips and a plurality of second chips.

As shown in FIG. 11, the chip packaging further includes an electrical insulation layer 160, which is disposed between the first chip 110/second chip 180 and the first top surface 101 of the substrate 100. The first chip 110 or the second chip 180 is, for example, a digital chip configured to process a digital logic signal.

Figure 12:
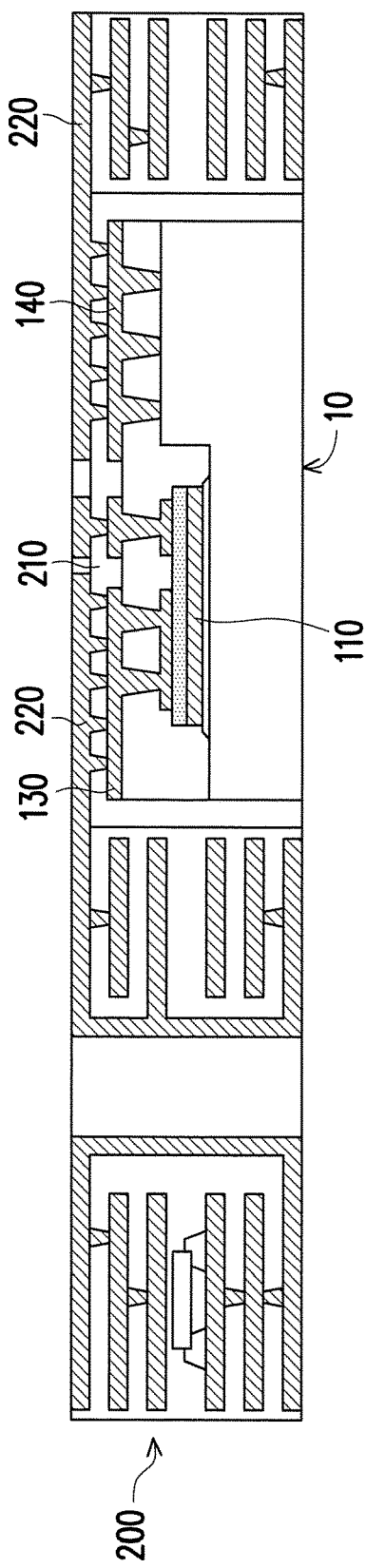
FIG. 12 is a schematic diagram illustrating a composite system board according to an embodiment of the disclosure.

FIG. 12 is a schematic diagram illustrating a composite system board according to an embodiment of the disclosure, and the present embodiment is combined with the chip packaging as shown in FIG. 1. As shown in FIG. 12, a composite system board 20 of the present embodiment includes a multilayer circuit board 200, a chip packaging 10, a first dielectric layer 210, and a third circuit 220. The multilayer circuit board 200 is, for example, a panel-level circuit board and has a containing hole 201 (as shown as in FIG. 15M and FIG. 15N). The containing hole 201 is formed on the multilayer circuit board 200, for example, by means of drilling, etching and other appropriate techniques. The chip packaging 10 is disposed in the containing hole 201 of the multilayer circuit board 200, and the chip packaging 10 and the multilayer circuit board 200 are connected with each other through an adhesive material or other bonding technique. The first dielectric layer 210 covers the chip packaging 10 and the multilayer circuit board 200, so the chip packaging 10 and the multilayer circuit board 200 are prevented from producing unnecessary conduction phenomenon. The third circuit 220 is disposed on the first dielectric layer 210 and passes through the first dielectric layer 210 to electrically connect to the first circuit 130 or the second circuit 140 of the chip packaging 10. In other embodiments, the third circuit 220 may be electrically connected to the first circuit 130 and the second circuit 140, simultaneously. In this way, the present embodiment achieves the purpose of integrating the chip packaging 10 and the multilayer circuit board 200, thereby providing the chip packaging of the disclosure with modular characteristics.

Figure 13:
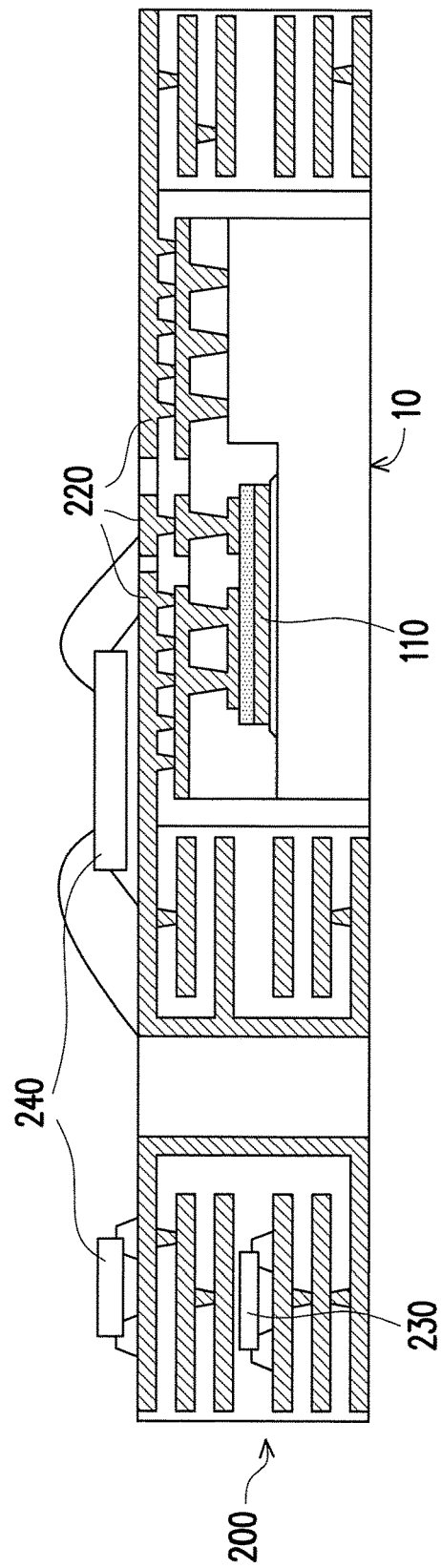
FIG. 13 is a schematic diagram illustrating a composite system board according to an embodiment of the disclosure.
Figure 14:
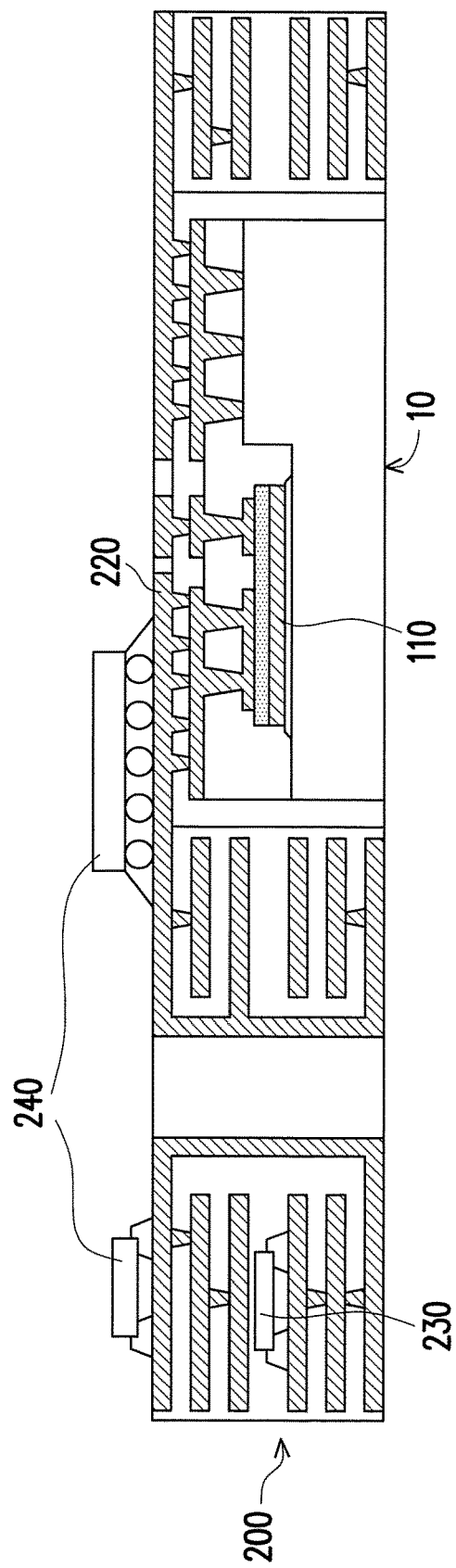
FIG. 14 is a schematic diagram illustrating a composite system board according to an embodiment of the disclosure.

FIG. 13 to FIG. 14 are schematic diagrams illustrating two composite system boards respectively according to two embodiments of the disclosure. Referring to FIG. 13, in the present embodiment, the composite system board further includes a first chip module 230 and a second chip module 240. The first chip module 230 is embedded in the multilayer circuit board 200 and electrically connected to the multilayer circuit board 200. The second chip module 240 is disposed on the multilayer circuit board 200 and electrically connected to the multilayer circuit board 200 and the chip packaging 10. In the present embodiment, the second chip module 240 may be a digital chip or an analog chip, and may be disposed on the multilayer circuit board 200, for example, by means of wiring or flip-chip process. In addition, the first chip module 230 may be a digital chip or an analog chip.

Figure 15A:
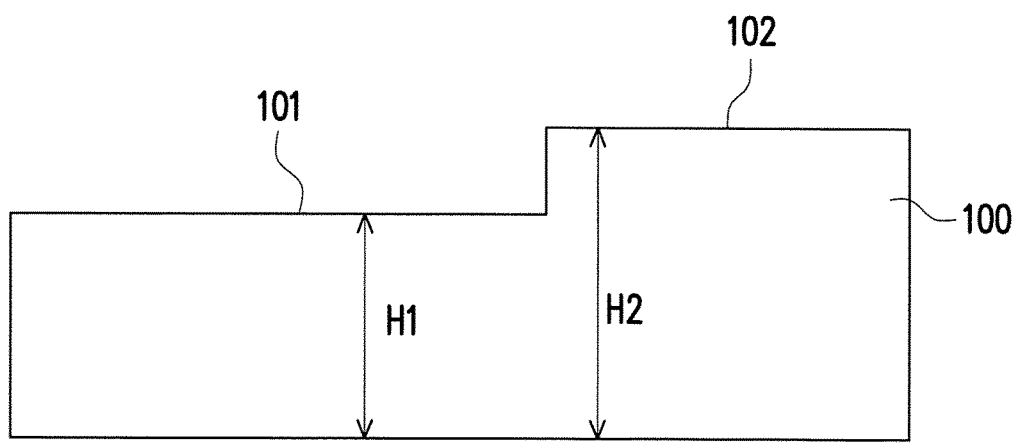
FIG. 15A to FIG. 15S are schematic diagrams illustrating a manufacturing method of the chip packaging and the composite system board according to an embodiment of the disclosure.

FIG. 15A to FIG. 15S are schematic diagrams illustrating a manufacturing method of the chip packaging and the composite system board according to an embodiment of the disclosure. In the present embodiment, the same or similar notations are adopted to represent the same or similar components so as to describe each process step in detail, and should not be regarded as limiting the technical solution of the disclosure.

Figure 15B:
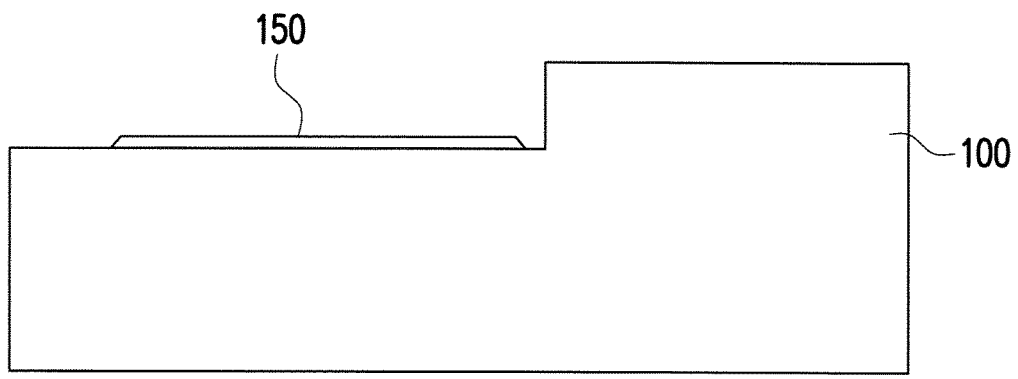
Figure 15C:
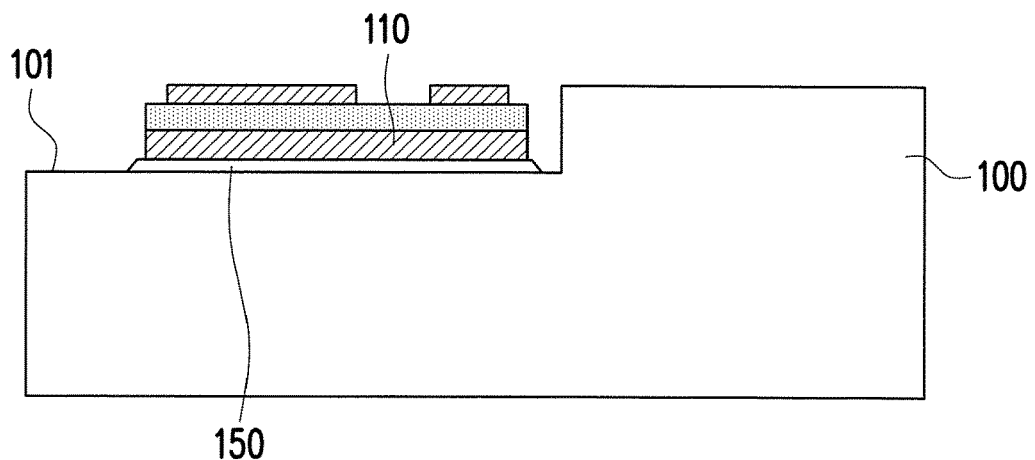
Figure 15D:
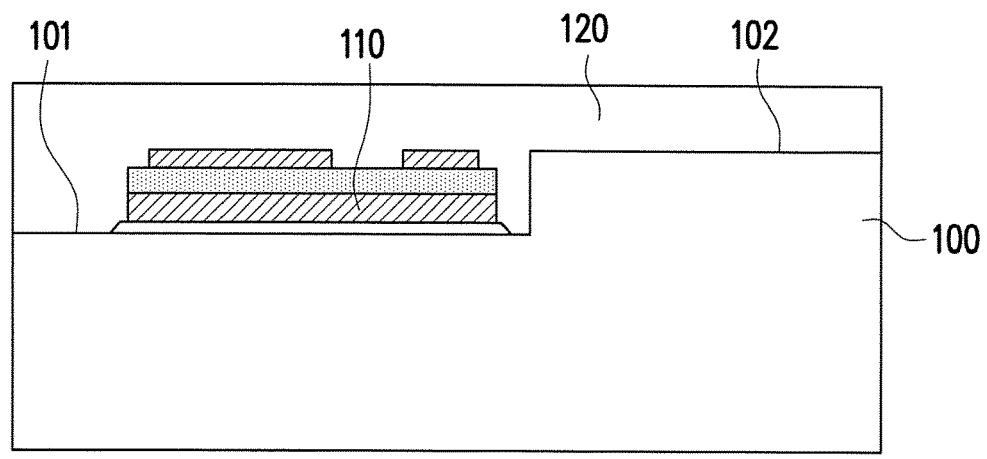
Figure 15E:
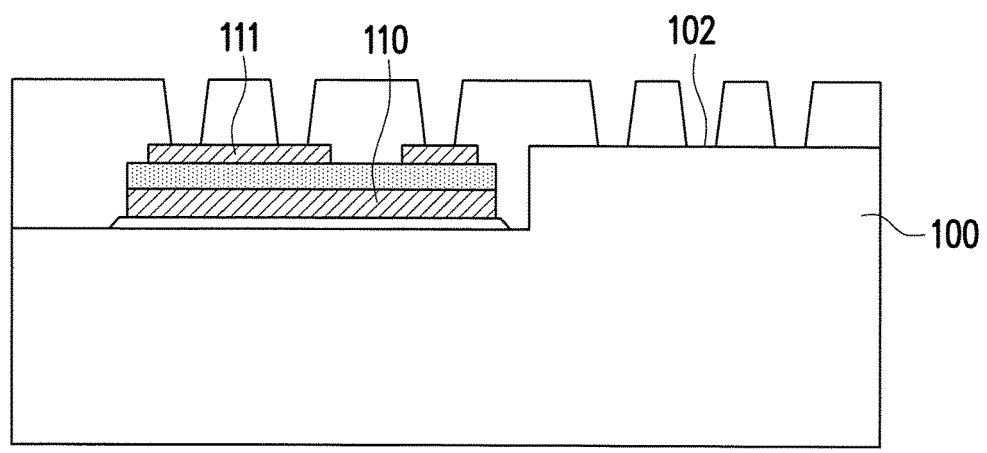

Firstly, as shown in FIG. 15A, a substrate 100 such as a L-shaped copper block structure is provided. The substrate 100 includes a first top surface 101 and a second top surface 102. A first height H1 of the first top surface 101 relative to a bottom surface is smaller than a second height H2 of the second top surface 102 relative to the bottom surface. Next, as shown in FIG. 15B, the first conductive adhesive layer 150 is disposed on the first top surface 101 of the substrate 100 by means of coating process or electroplating process. As shown in FIG. 15C, the first chip 110 is disposed on the first conductive adhesive layer 150 and electrically connected to the first top surface 101 of the substrate 100. As shown in FIG. 15D, the molding material 120 is disposed on the substrate 100 through a mold process, and covers the first chip 110 and the first top surface 101. Next, as shown in FIG. 15E, a plurality of holes is drilled on the molding material 120 with laser drilling technology. The holes of the molding material 120 are corresponded to the first top electrode 111 of the first chip 110 and the second top surface 102 of the substrate 100.

Figure 15F:
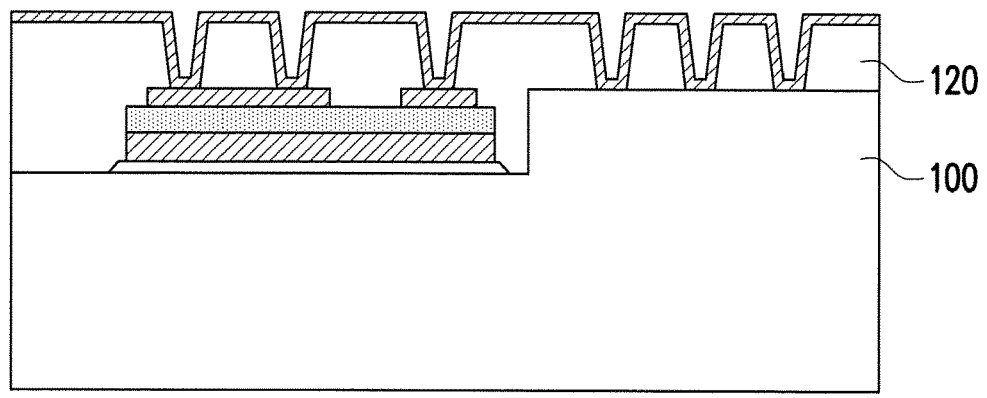
Figure 15G:
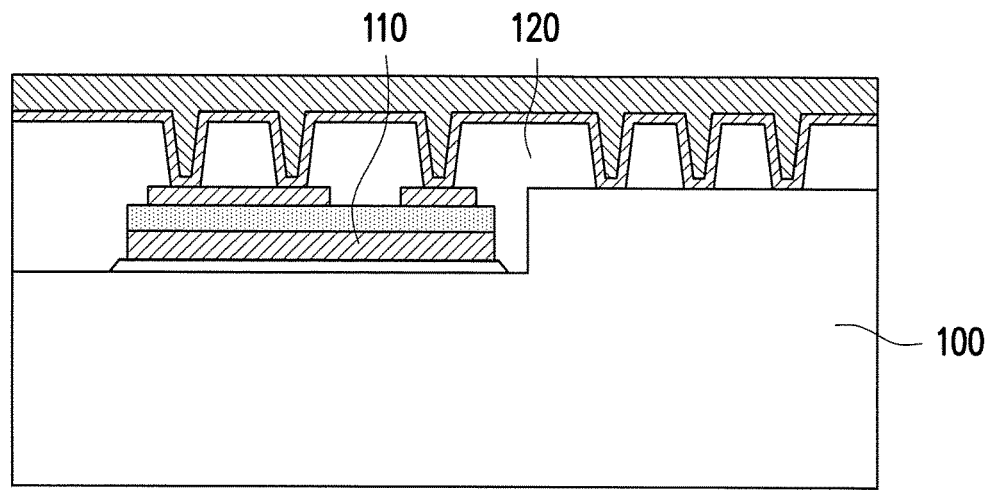
Figure 15H:
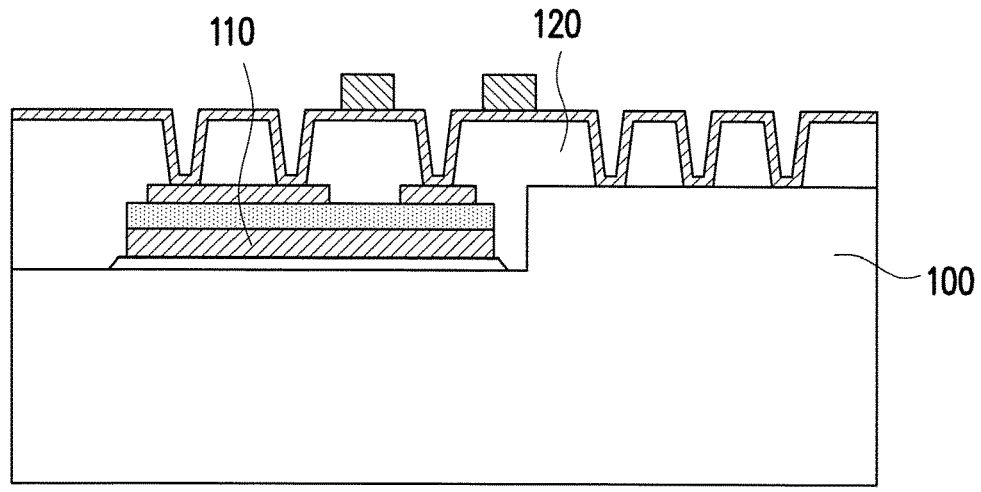

Afterwards, as shown in FIG. 15F, a copper seed layer is forming on the molding material 120 and within its holes by means of chemical deposition (electroless plating). As shown in FIG. 15G, a photoresist is coated on the copper seed layer. As shown in FIG. 15H, a patterning process is performed to the photoresist by means of etching or other method, so as to cover parts of the copper seed layer and to expose the rest parts of the copper seed layer. As such, circuit patterns of the first circuit 130 and the second circuit 140 are formed.

Figure 15I:
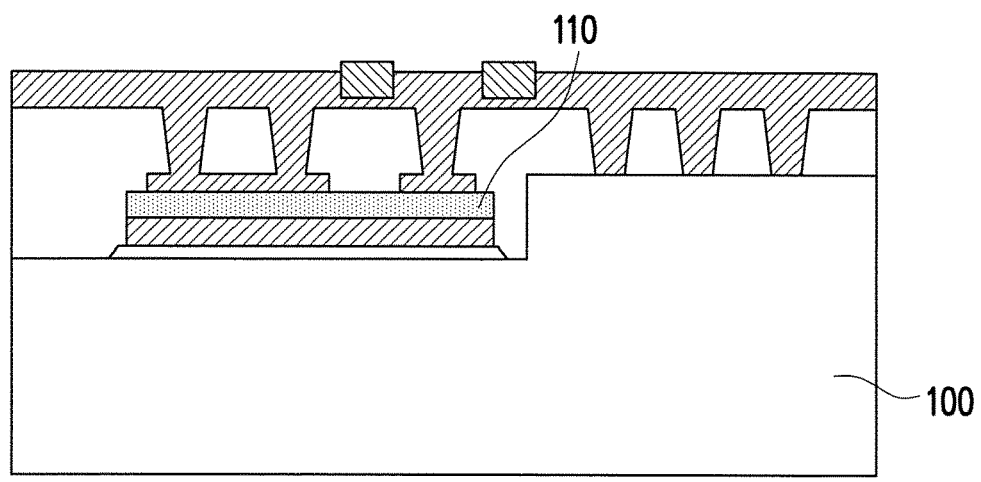
Figure 15J:
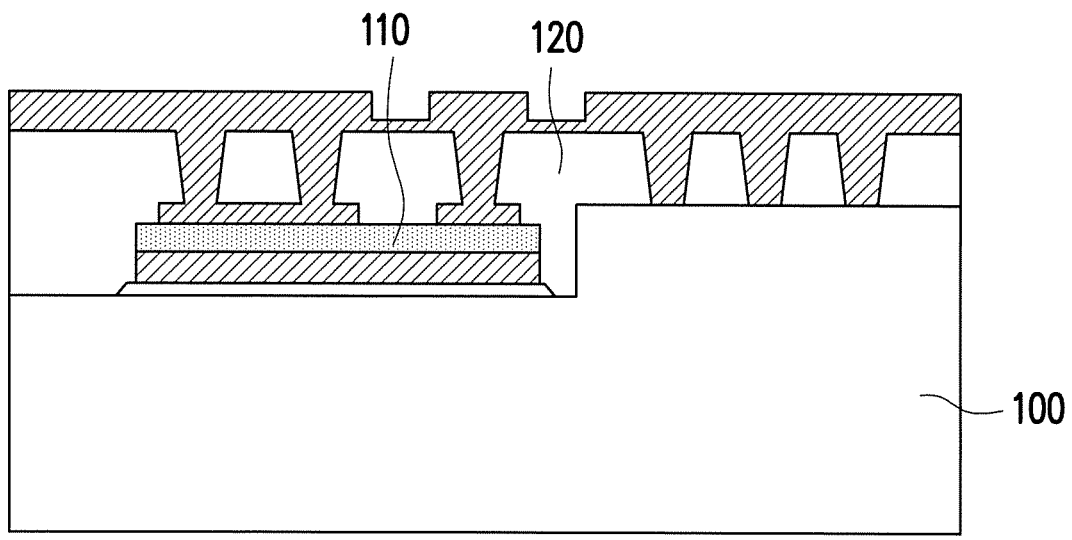
Figure 15K:
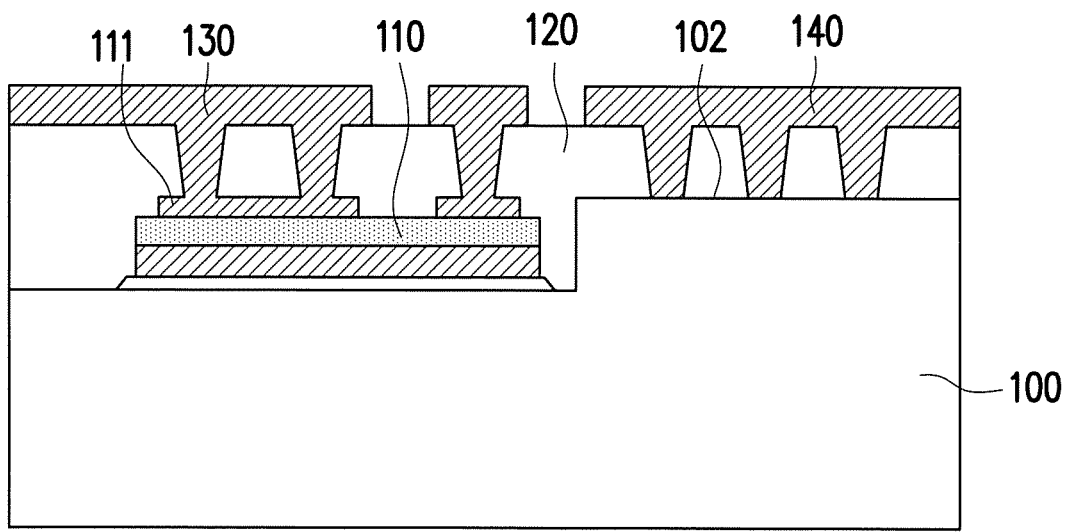

Further, as shown in FIG. 15I, a conductive layer is formed on the copper seed layer by adopting an electroplating process, wherein the conductive layer is not formed on the parts of the copper seed layer that are blocked by the photoresist. As shown in FIG. 15J, the photoresist surrounded by the conductive layer is removed, so that the copper seed layer underneath the photoresist is exposed. As shown in FIG. 15K, the remaining copper seed layer on the molding material 120 is removed by an etching process, so that two portions of the conductive layer are respectively formed into the first circuit 130 and the second circuit 140 which are not communicated with each other. The first circuit 130 passes through the molding material 120 to electrically connect to the first top electrode 111, and the second circuit 140 passes through the molding material 120 to electrically connect to the second top surface 102 of the substrate 100. As such, the manufacturing process of the chip packaging 10 is completed.

Figure 15L:
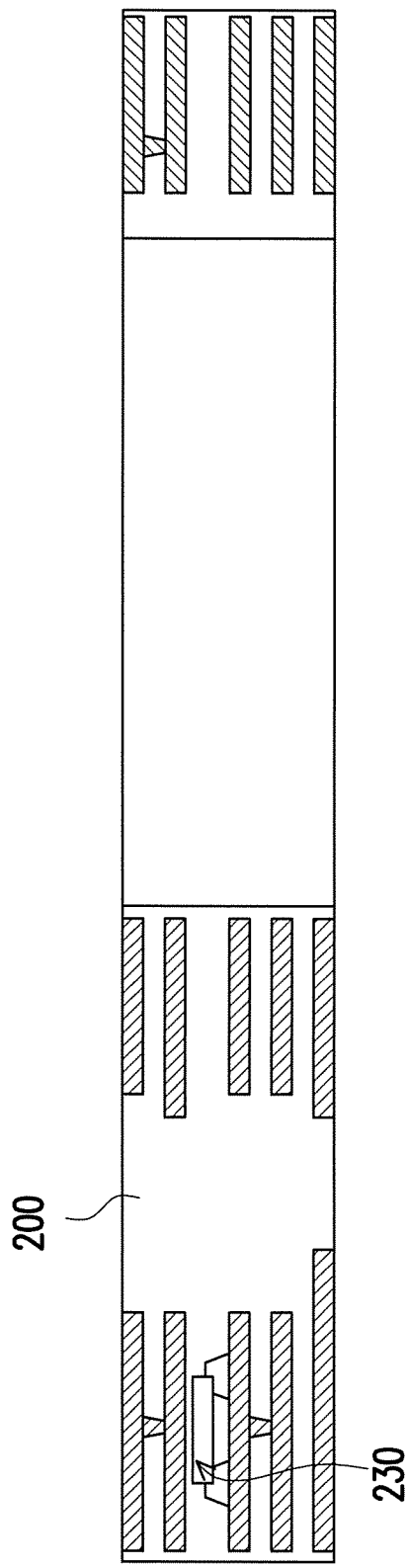
Figure 15M:
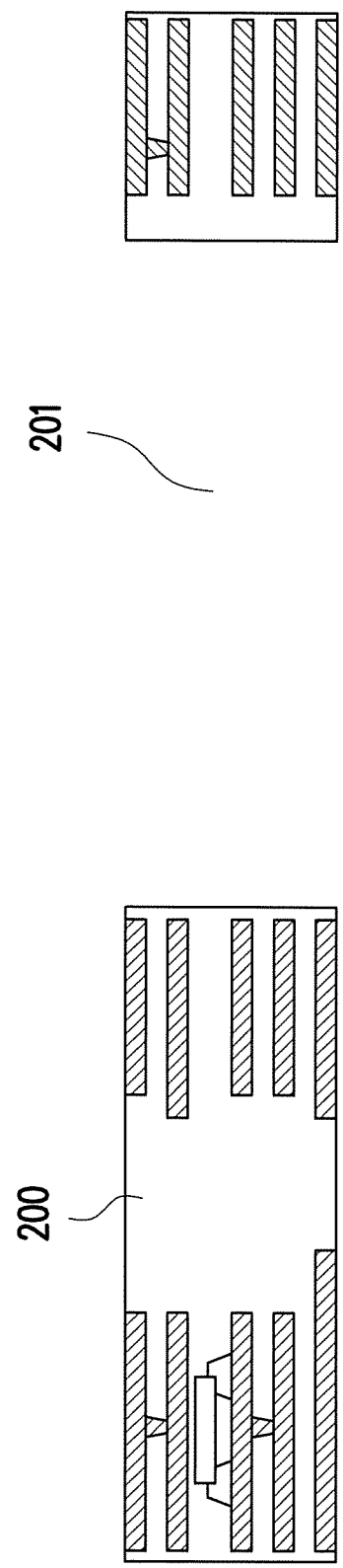

Next, as shown in FIG. 15L, a multilayer circuit board 200 having a first chip module 230 embedded therein is provided. As shown in FIG. 15M, a drilling process is performed at a specific orientation on the multilayer circuit board 200 to form a containing hole 201 which penetrates two sides of the multilayer circuit board 200. As shown in FIG. 15N, the chip packaging 10 is disposed into the containing hole 201 of the multilayer circuit board 200, and a gap between the chip packaging 10 and an inner wall surface of the containing hole 201 is adjusted to be consistent all around so as to facilitate the subsequent bonding process. As shown in FIG. 15O, an adhesive material is placed in-between the chip packaging 10 and the containing hole 201 so as to tightly join the chip packaging 10 in the multilayer circuit board 200.

Figure 15P:
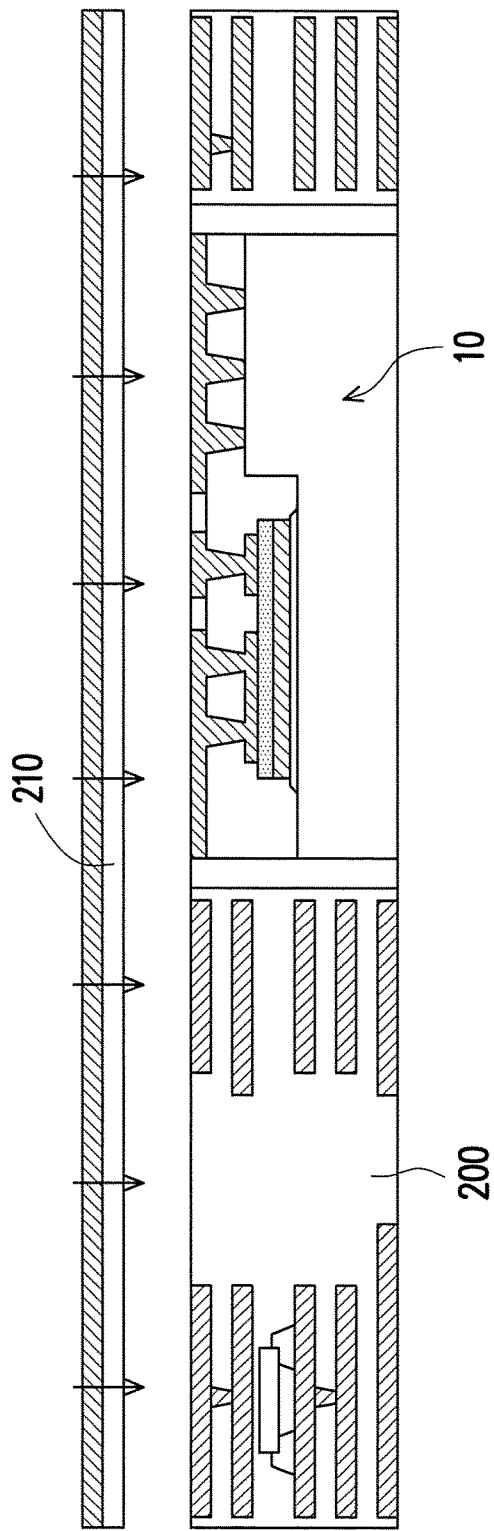
Figure 15Q:
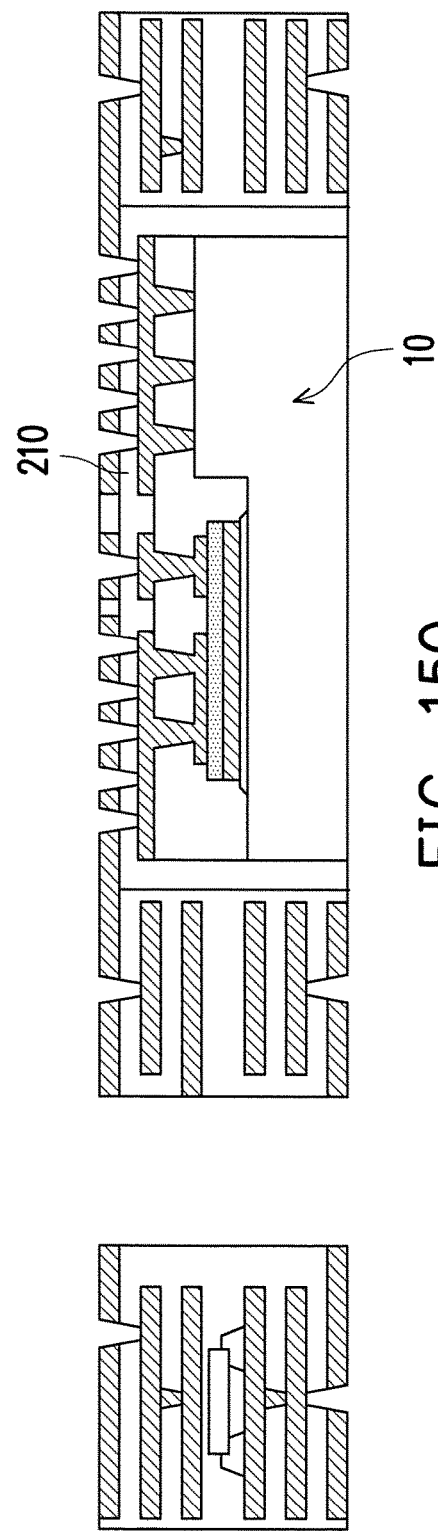

Afterwards, as shown in FIG. 15P, a first dielectric layer 210 is overlaid and bonded on the multilayer circuit board 200 and the chip packaging 10 by means of press-fitting technique. The first dielectric layer 210 is, for example, an insulating material which does not generate an electrical connection with the multilayer circuit board 200 and the chip packaging 10. As shown in FIG. 15Q, a drilling process, a decontamination process and a copper seed layer deposition are sequentially performed onto the first dielectric layer 210. Thus, the copper seed layer is distributed all over the surface and within every hole of first dielectric layer 210. As shown in FIG. 15R, copper forms a conductive layer on the surface and within every hole of the first dielectric layer 210 by means of electroplating process, and then the conductive layer is manufactured into a third circuit 220 by means of photolithography process, such as exposure, development and etching steps. As shown in FIG. 15S, a second chip module 240 is disposed on the multilayer circuit board 200, for example, by means of wiring, and is electrically connected to the multilayer circuit board 200 and the chip packaging 10. As such, the manufacturing of the composite system board is completed.

Figure 16A:
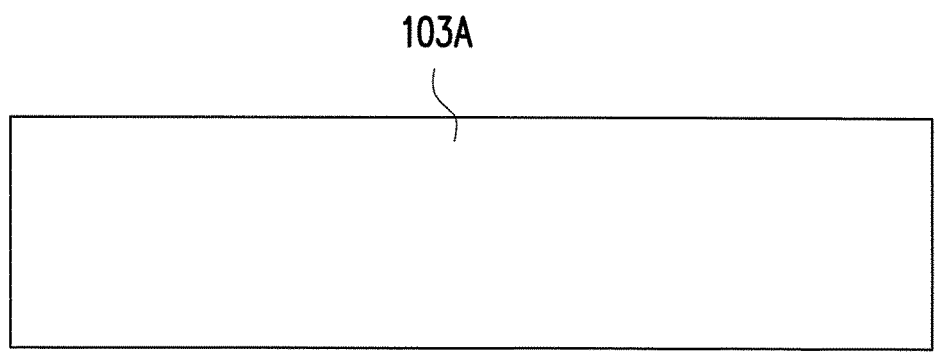
FIG. 16A to FIG. 16S are schematic diagrams illustrating a manufacturing method of the chip packaging and the composite system board according to an embodiment of the disclosure.
Figure 16B:
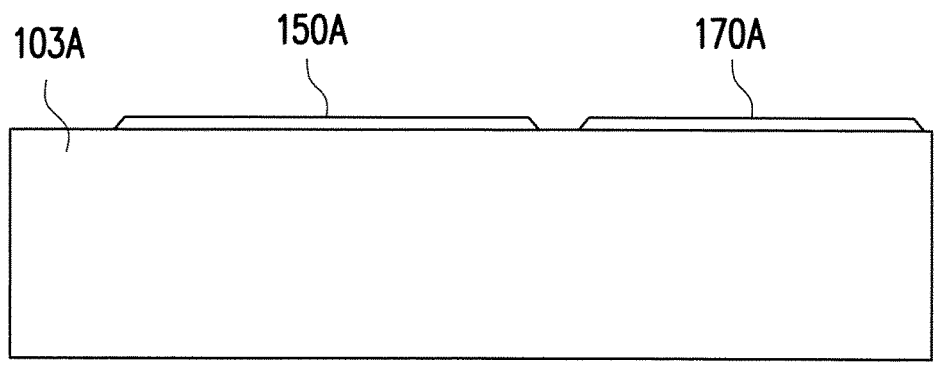
Figure 16C:
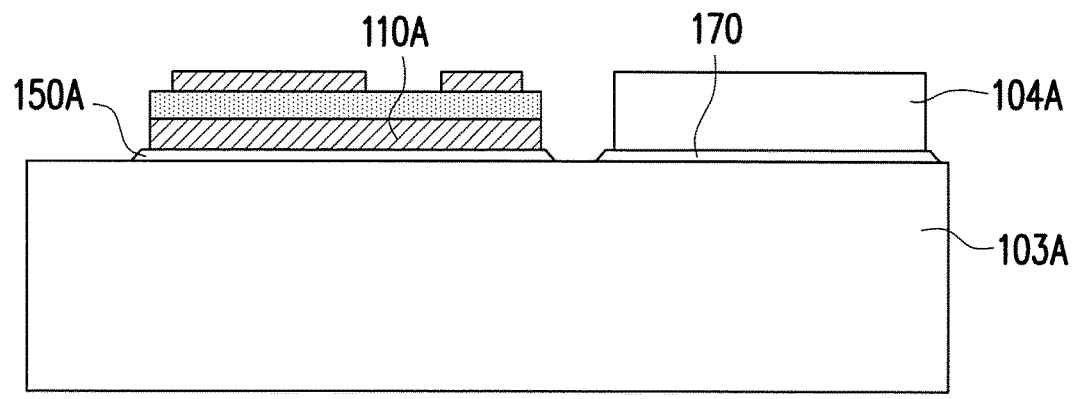
Figure 16D:
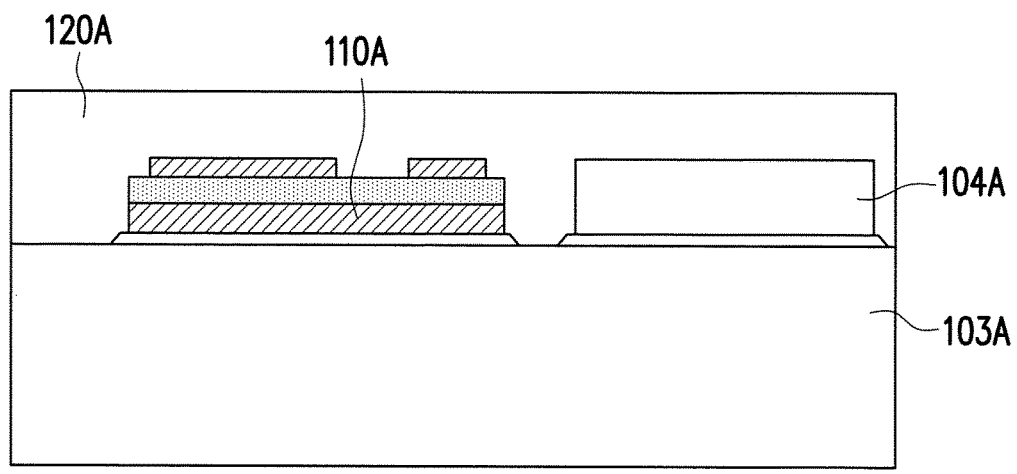
Figure 16E:
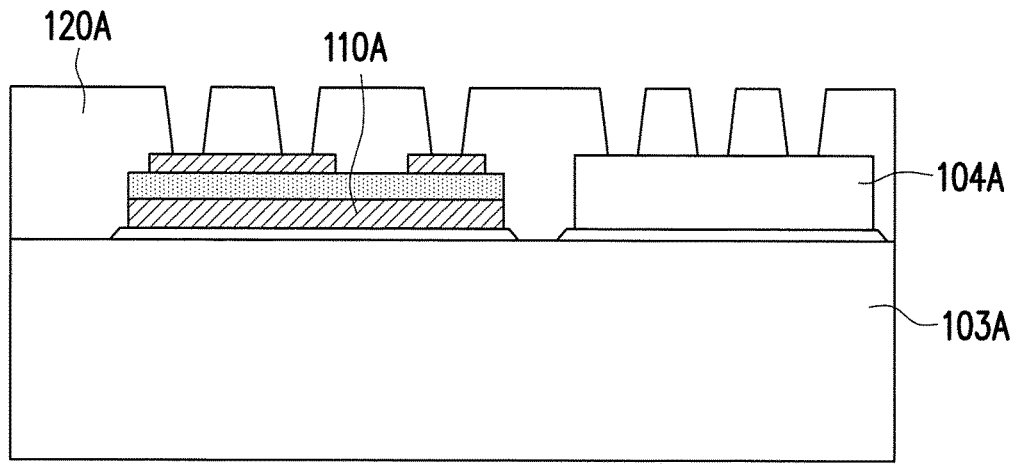
Figure 16F:
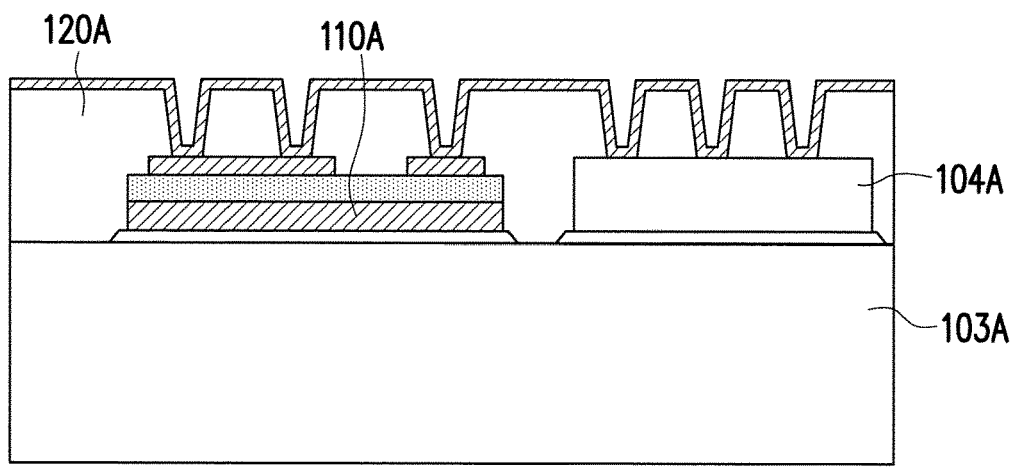
Figure 16G:
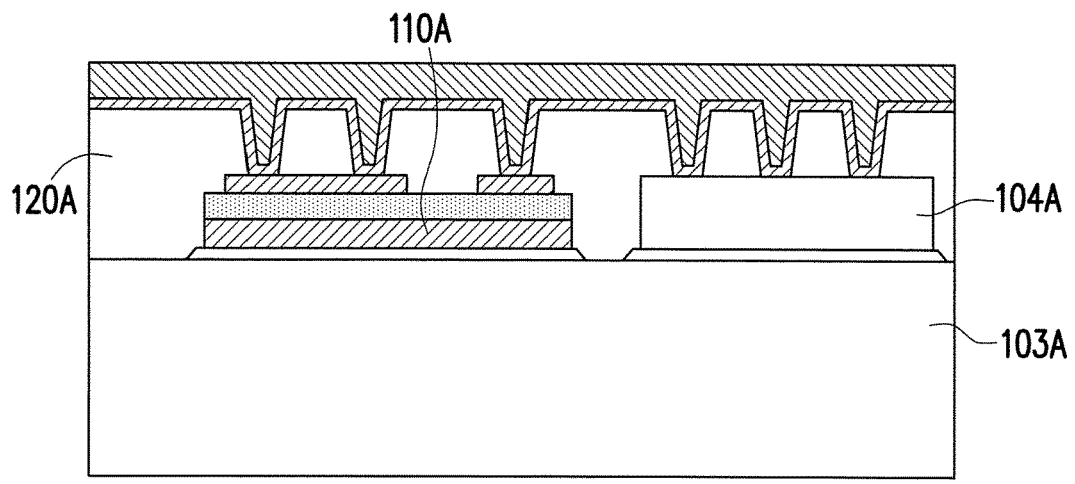
Figure 16H:
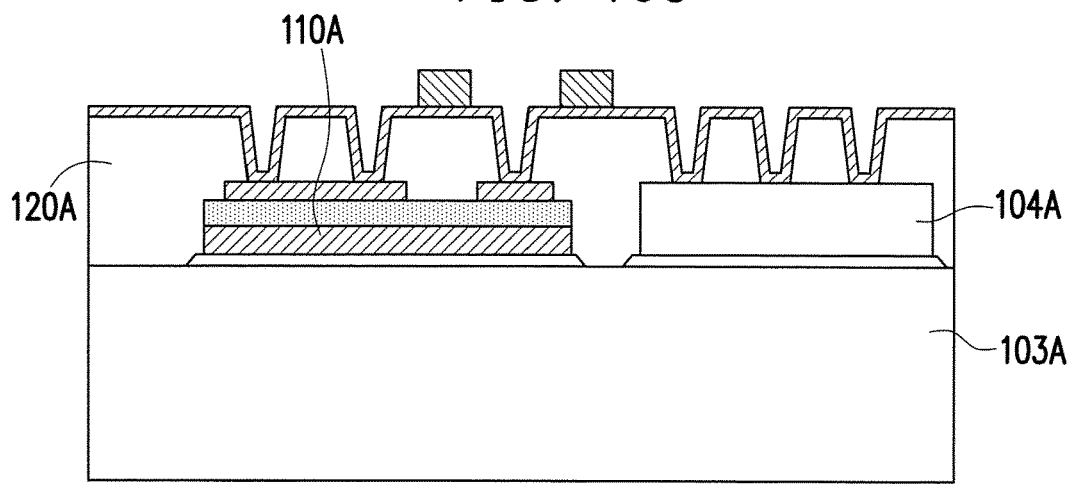
Figure 16I:
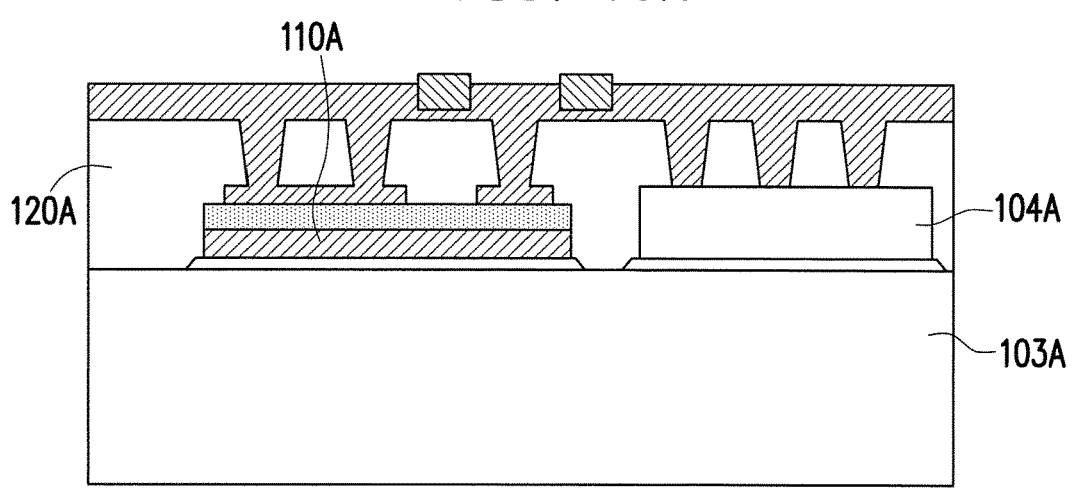
Figure 16J:
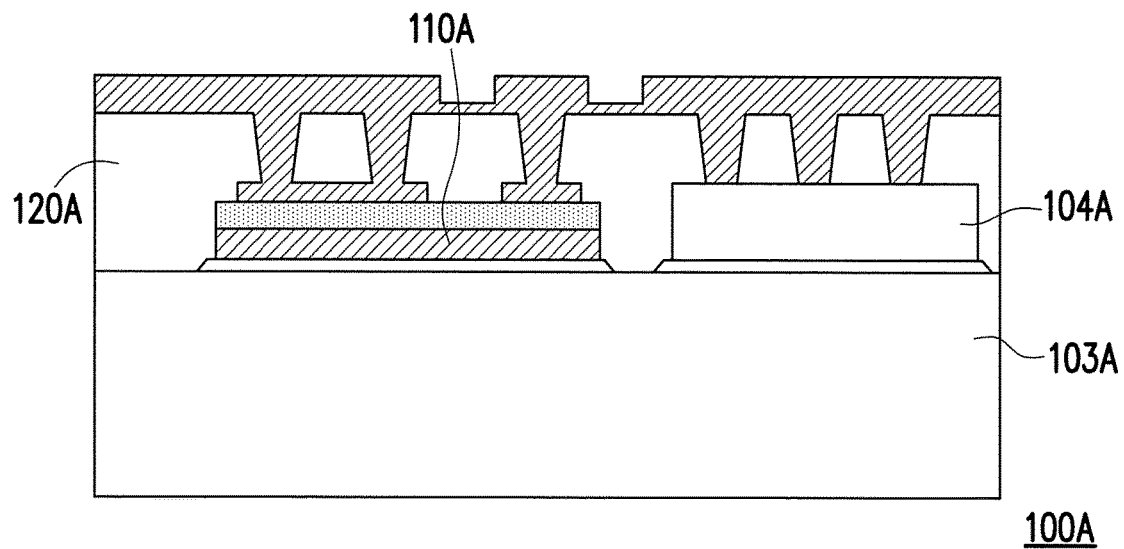
Figure 16K:
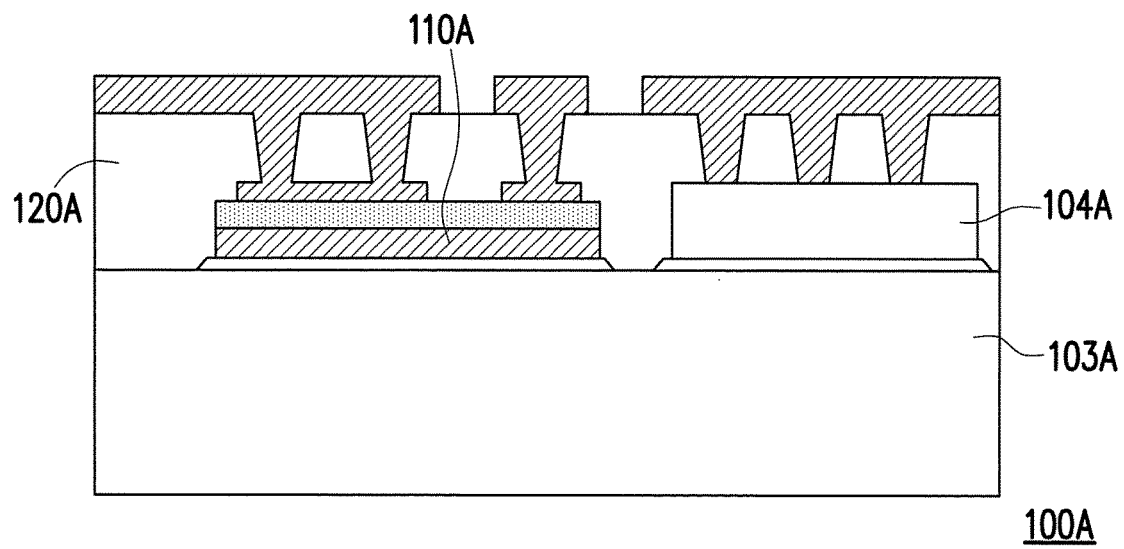
Figure 16L:
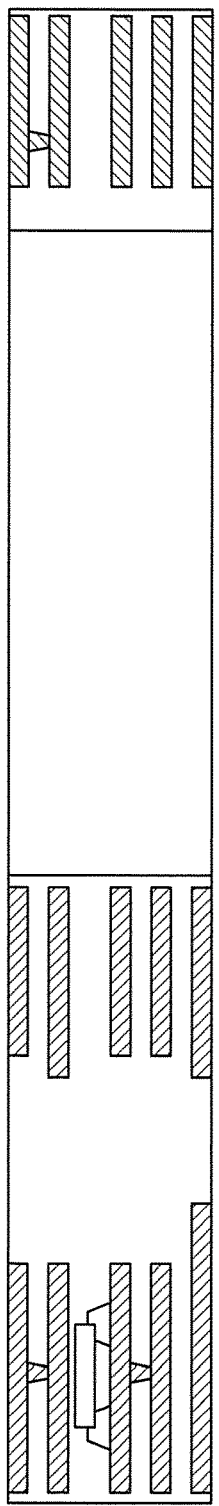
Figure 16M:
Figure 16P:
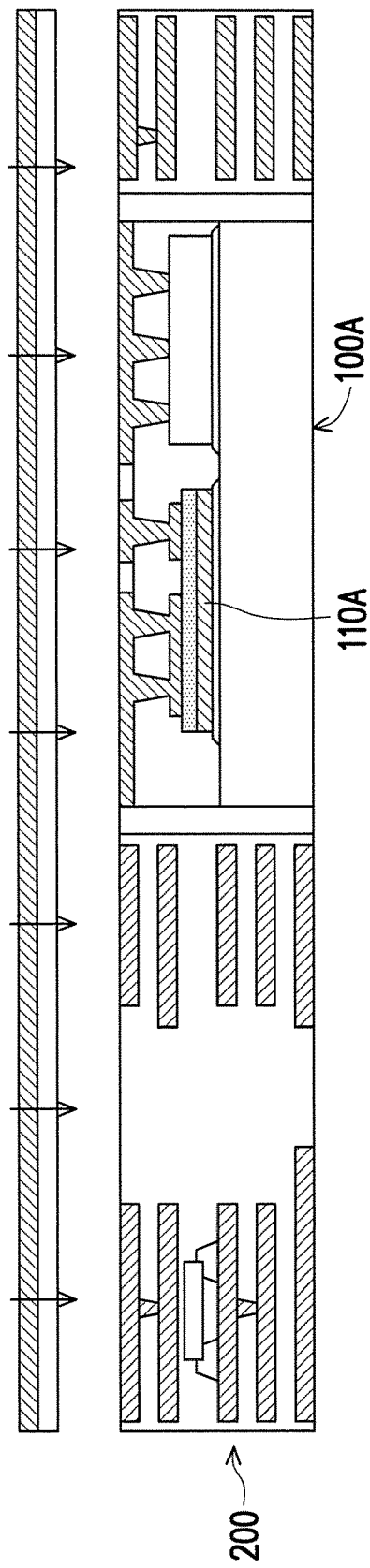
Figure 16Q:
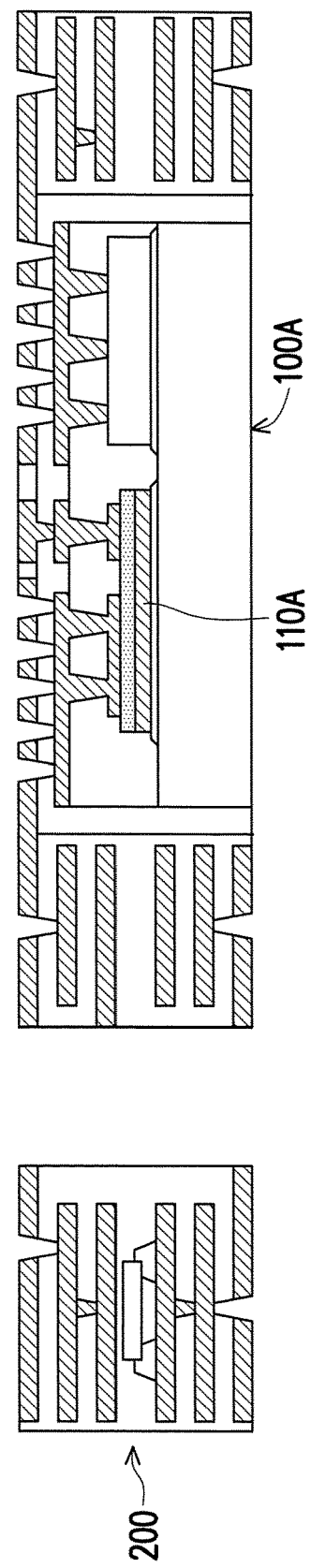
Figure 16R:
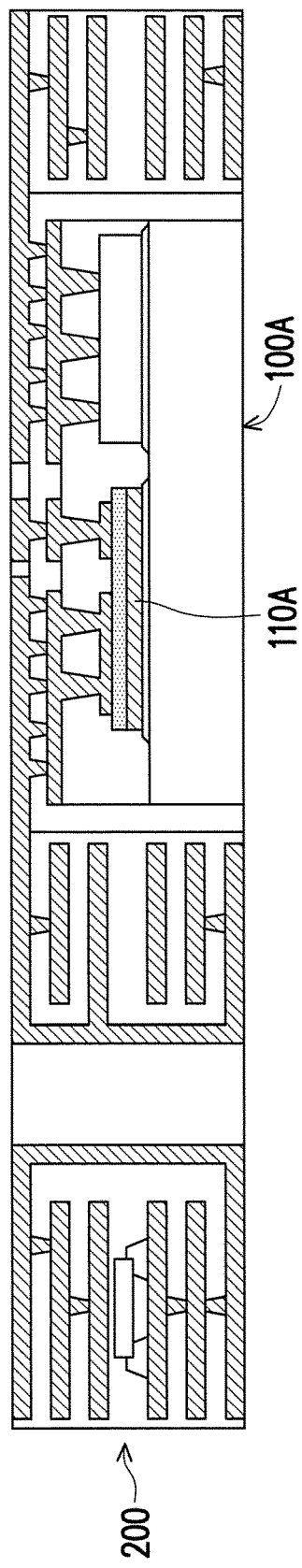
Figure 16S:
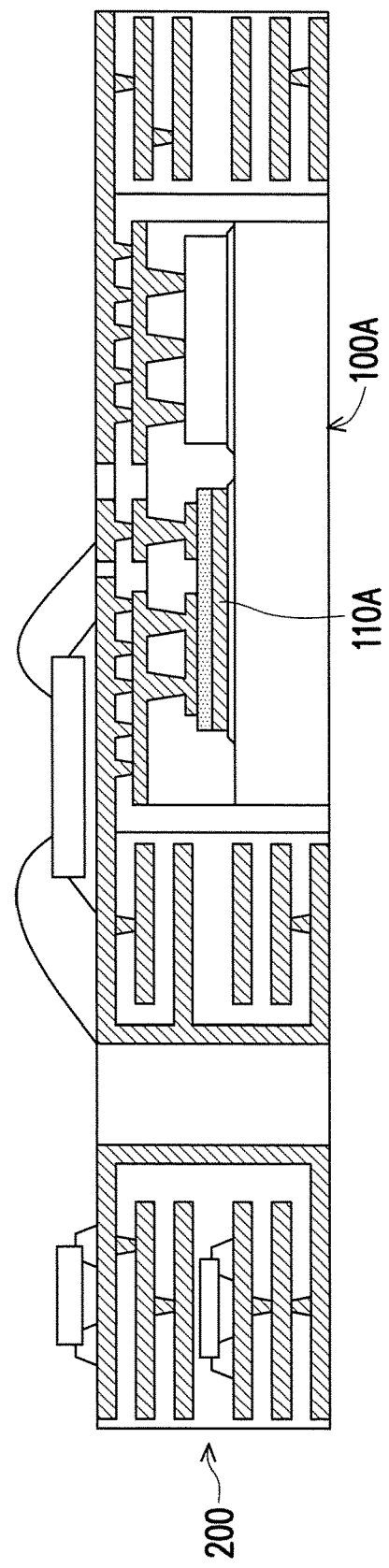

FIG. 16A to FIG. 16S are schematic diagrams illustrating a manufacturing method of the chip packaging and the composite system board according to an embodiment of the disclosure. The manufacturing method of the present embodiment is substantially the same as the manufacturing method shown in FIG. 15A to FIG. 15S. The present embodiment is combined with the chip packaging shown in FIG. 3. A difference lies in that, as shown in FIG. 16A, the present embodiment provides a substrate 100A which includes a first conductor block 103A and a second conductor block 104A. Next, as shown in FIG. 16B, the first conductive adhesive layer 150A and the second conductive adhesive layer 170A are dispose don the first conductor block 103A by means of coating process or electroplating process, and the first conductive adhesive layer 150A and the second conductive adhesive layer 170A have a gap therebetween and thus are not conductive with each other.

As shown in FIG. 16C, the first chip 110A is adhered on the first conductive adhesive layer 150A so as to be electrically connected with the first conductor block 103A of the substrate 100A, and the second conductor block 104A is adhered on the second conductive adhesive layer 170A so as to be electrically connected with the first conductor block 103A. As shown in FIG. 16D, the molding material 120A is disposed on the substrate 100A by means of mold process, and covers the first chip 110A, the first conductor block 103A and the second conductor block 104A. Therefore, a difference between the present embodiment and the previous embodiment lies in the substrate. The substrate 100A of the present embodiment is constituted by the first conductor block 103A and the second conductor block 104A, while the substrate 100 of the previous embodiment is an integrally formed structure.

The chip packaging of the present embodiment is as shown in FIG. 16K. Details regarding the manufacturing process of the chip packing of the present embodiment as show in FIG. 16E to FIG. 16K can be referred to the literary descriptions provided for FIG. 15E to FIG. 15K. The composite system board of the present embodiment is as shown in FIG. 16S. Details regarding the manufacturing process of the composite system board of the present embodiment as show in FIG. 16L to FIG. 16S can be referred to the literary descriptions provided for FIG. 15L to FIG. 15S.

Figure 17A:
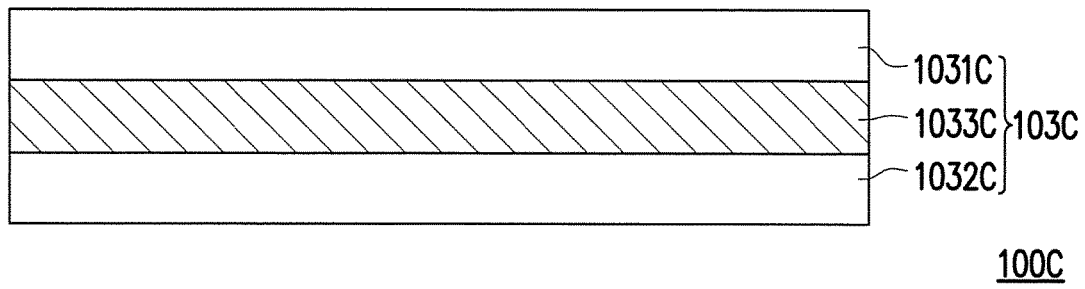
FIG. 17A to FIG. 17S are schematic diagrams illustrating a manufacturing method of the chip packaging and the composite system board according to an embodiment of the disclosure.
Figure 17B:
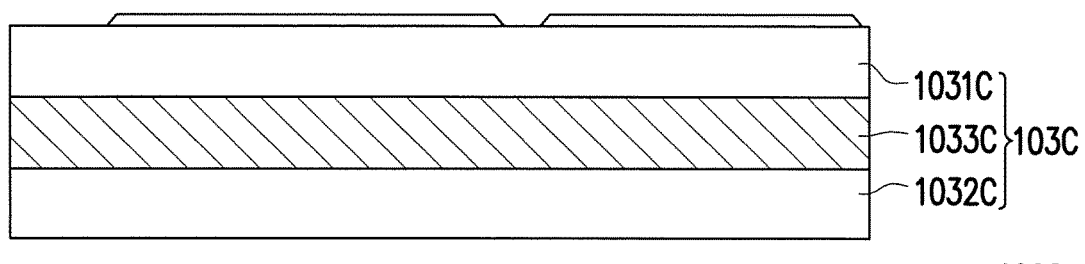
Figure 17C:
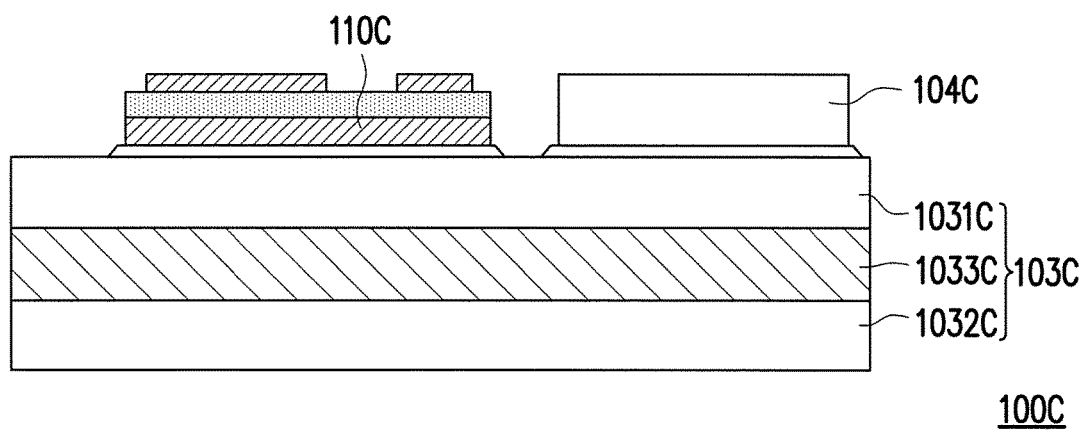
Figure 17D:
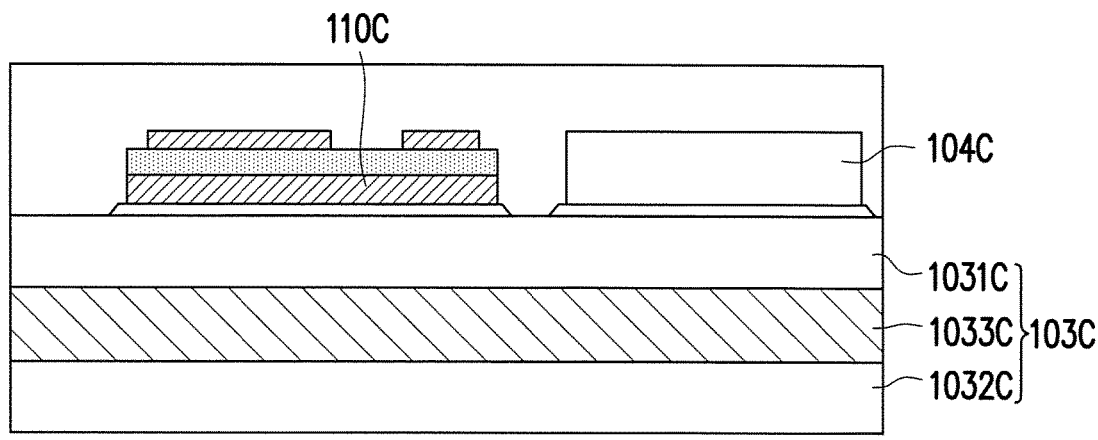
Figure 17E:
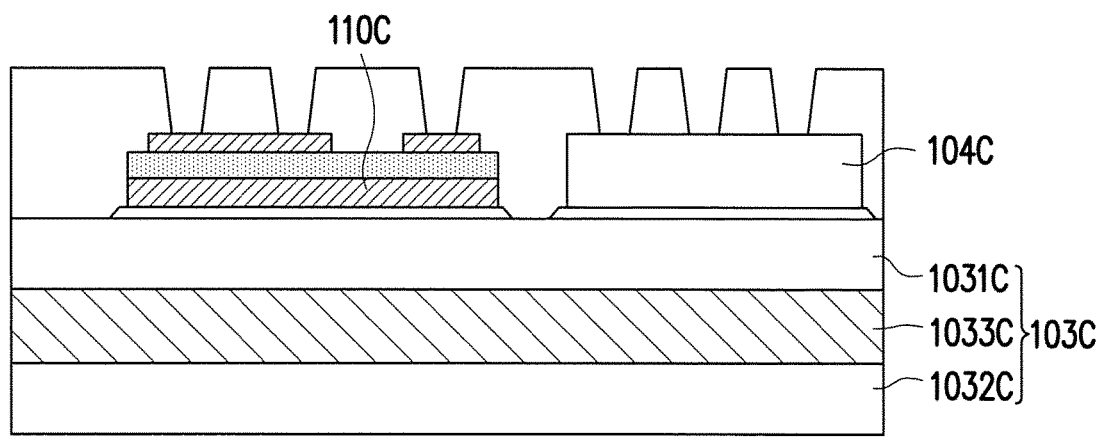
Figure 17F:
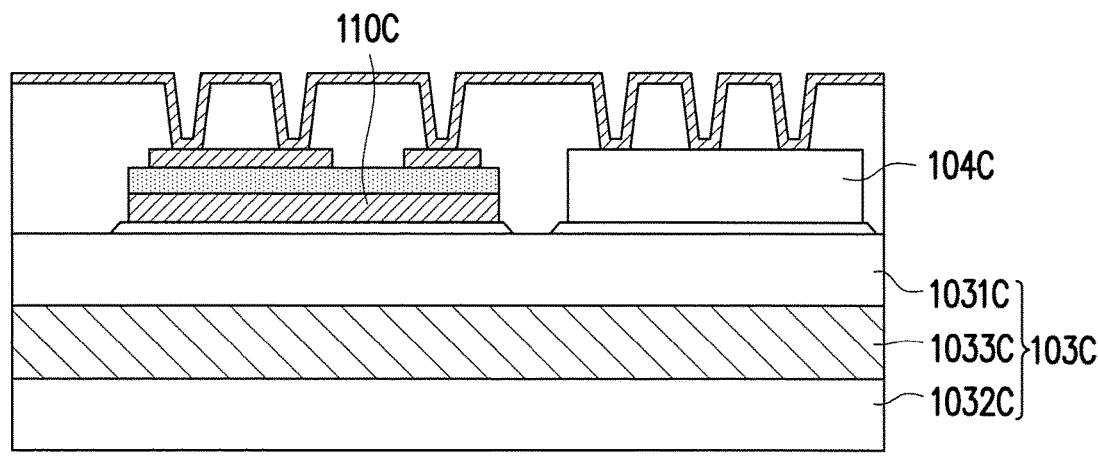
Figure 17G:
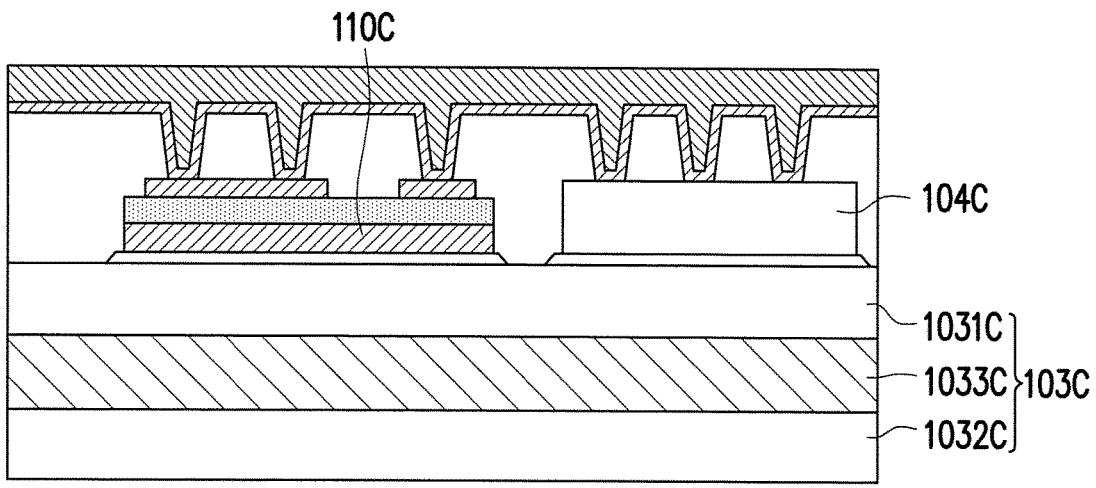
Figure 17H:
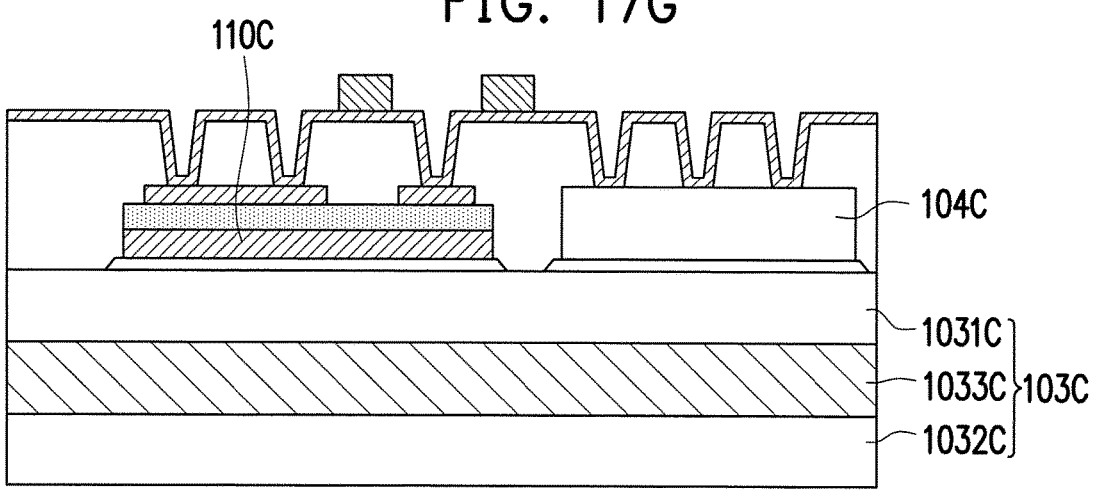
Figure 17I:
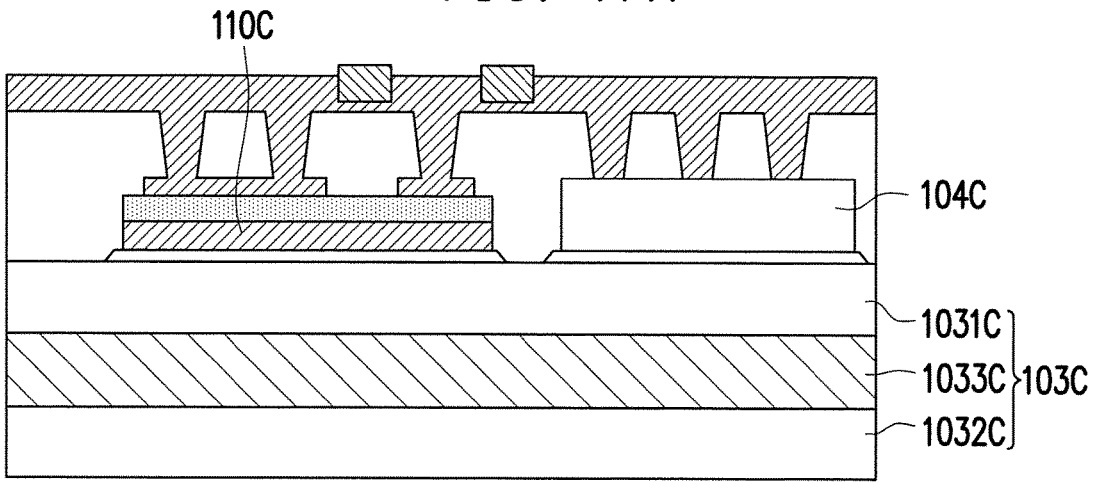
Figure 17J:
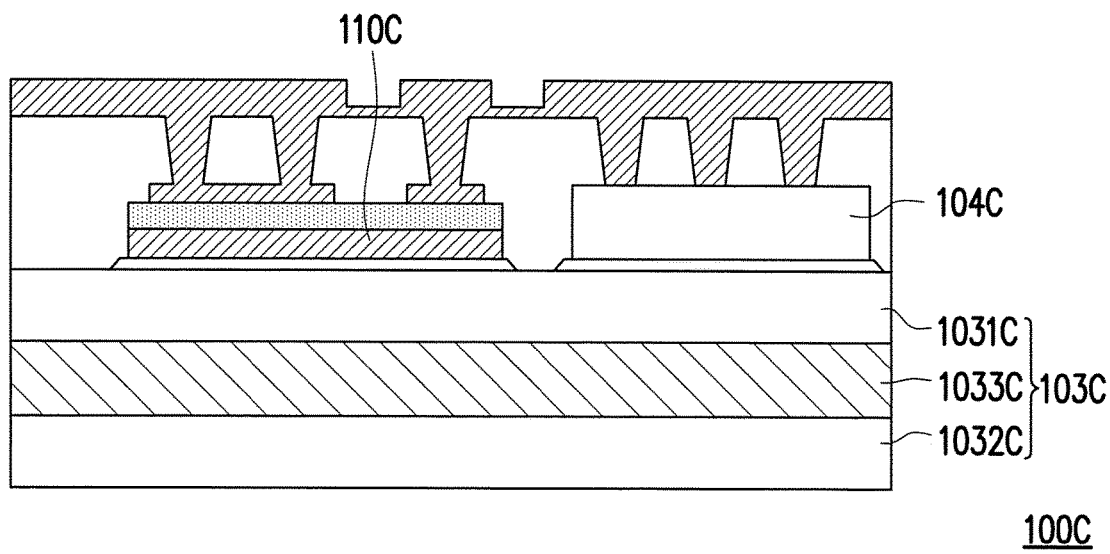

FIG. 17A to FIG. 17S are schematic diagrams illustrating a manufacturing method of the chip packaging and the composite system board according to an embodiment of the disclosure. The manufacturing process of the present embodiment is substantially the same as the manufacturing method shown in FIG. 16A to FIG. 16S. The present embodiment is combined with the chip packaging as shown in FIG. 5. Differences are as shown in FIG. 17A, such that a substrate 100C of the present embodiment includes a multilayer board 103C. The multilayer board 103C has a first conductive layer 1031C, a second conductive layer 1032C and a dielectric layer 1033C. The dielectric layer 1033C is disposed between the first conductive layer 1031C and the second conductive layer 1032C. That is, the differences between the present embodiment and the previous embodiment lies in that the substrate 100C includes the multilayer board 103C and is disposed with the dielectric layer 1033C that has the heat dissipating and insulation characteristics.

Figure 17K:
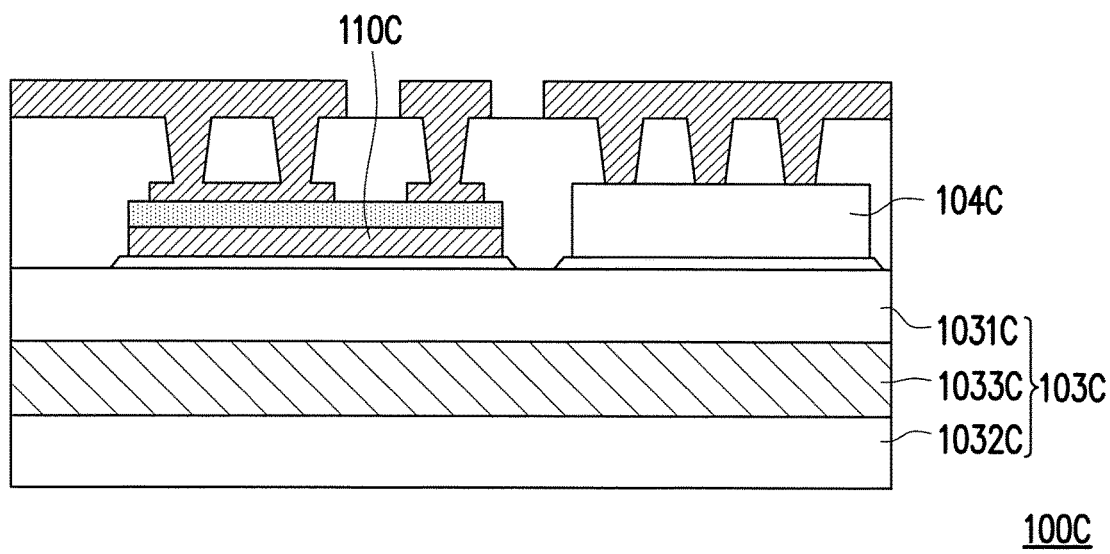
Figure 17L:
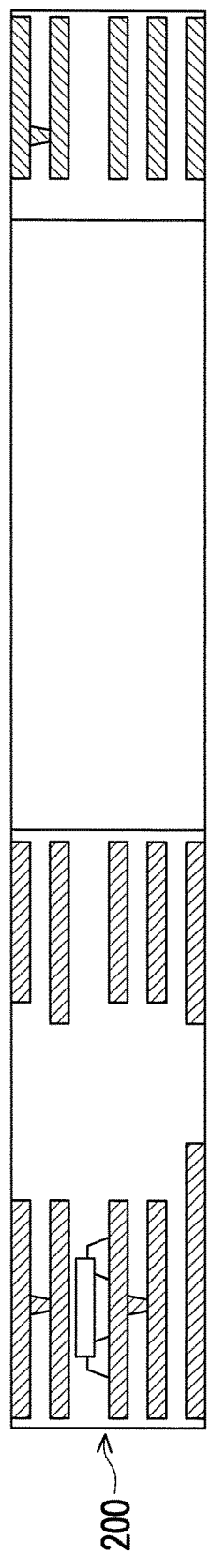
Figure 17M:
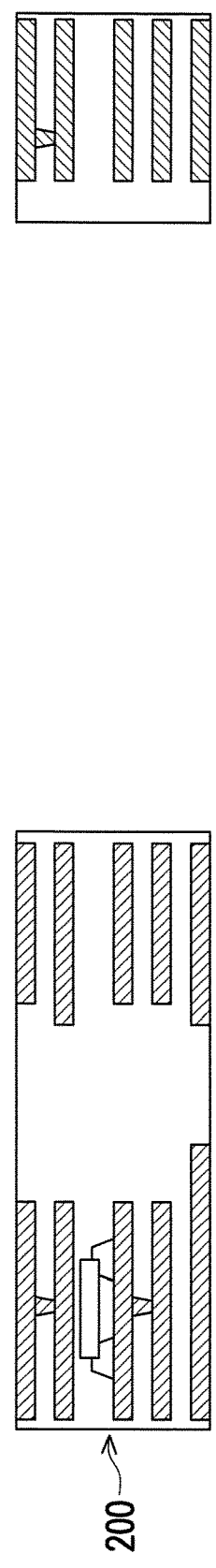

FIG. 17K shows a schematic diagram of a chip packaging of the present embodiment. Details regarding the manufacturing process of the chip packing of the present embodiment as show in FIG. 17B to FIG. 17K can be referred to the literary descriptions provided for FIG. 15B to FIG. 15K. FIG. 17S shows a schematic diagram of a composite system board of the present embodiment. Details regarding the manufacturing process of the composite system board of the present embodiment t as show in FIG. 17L to FIG. 17S can be referred to the literary descriptions provided for FIG. 15L to FIG. 15S.

Figure 18C:
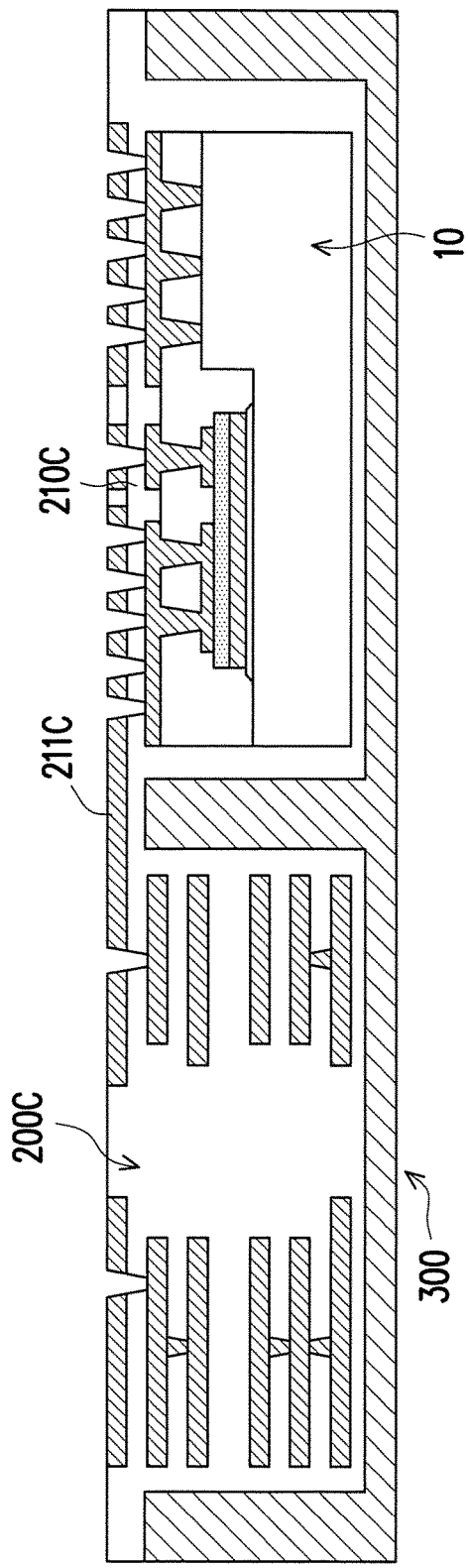
Figure 18D:
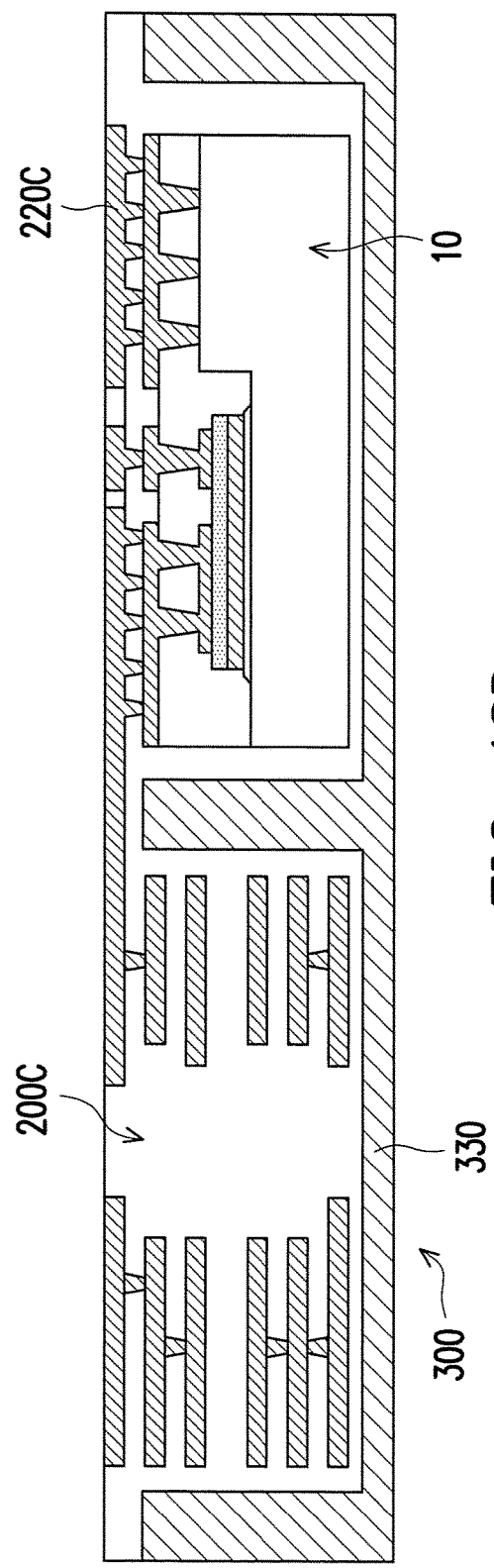

FIG. 18A to FIG. 18D are schematic diagrams illustrating the structure composition of a composite system board according to another embodiment of the disclosure. The present embodiment is combined with the chip packaging 10 as shown in FIG. 1. As shown in FIG. 18A, a multilayer circuit board 200C and a chip packaging 10 are pre-manufactured. As shown in FIG. 18B, in the present embodiment, the composite system board further includes a bearing member 300, which has a first groove 310 and a second groove 320. The multilayer circuit board 200C and the chip packaging 10 are respectively disposed into the first groove 310 and the second groove 320 of the bearing member 300. The multilayer circuit board 200C and the chip packaging 10 are fixed in the bearing member 300 by means of mold process. The first dielectric layer 210C is disposed on the bearing member 300 by means of press-fitting process, and covers the multilayer circuit board 200C and the chip packaging 10. A surface of the first dielectric layer 210C away from the bearing member 300 is disposed with a seed layer 211C thereon by means of chemical deposition or other method. As shown in FIG. 18C, a drilling process is performed at positions on the first dielectric layer 210C which are corresponded to the multilayer circuit board 200C and the chip packaging 10 so as to form a plurality of openings being required. As shown in FIG. 18D, a conductive layer, such as a copper layer, is plated on the seed layer 211C and each of the openings of the first dielectric layer 210C by means of electroplating process. Then, the conductive layer is formed into a third circuit 220C, which passes through the first dielectric layer 210C and is electrically connected to the multilayer circuit board 200C and the chip packaging 10, by means of photolithography process.

Moreover, in the present embodiment, a bottom plate 330 of the bearing member 300 covers at the bottoms of the multilayer circuit board 200C and the chip packaging 10. The bottom plate 330 has effects of blocking external impact, shielding and heat dissipation. The bottom plate 330 may also be considered as a ground terminal of the composite system board.

Figure 19:
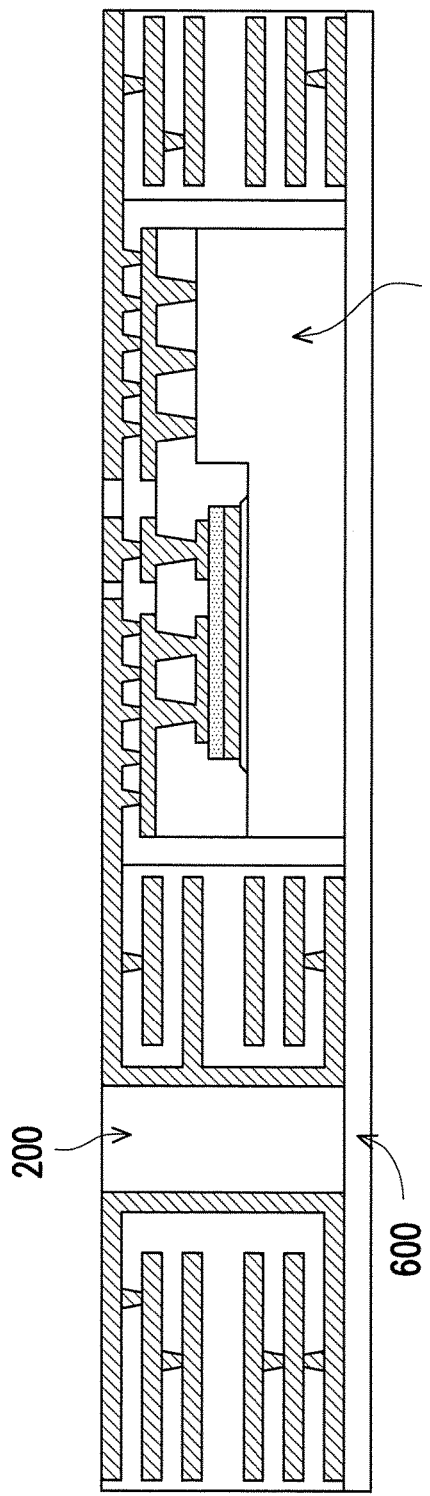
FIG. 19 is a schematic diagram illustrating a composite system board according to other embodiment of the disclosure.
Figure 20:
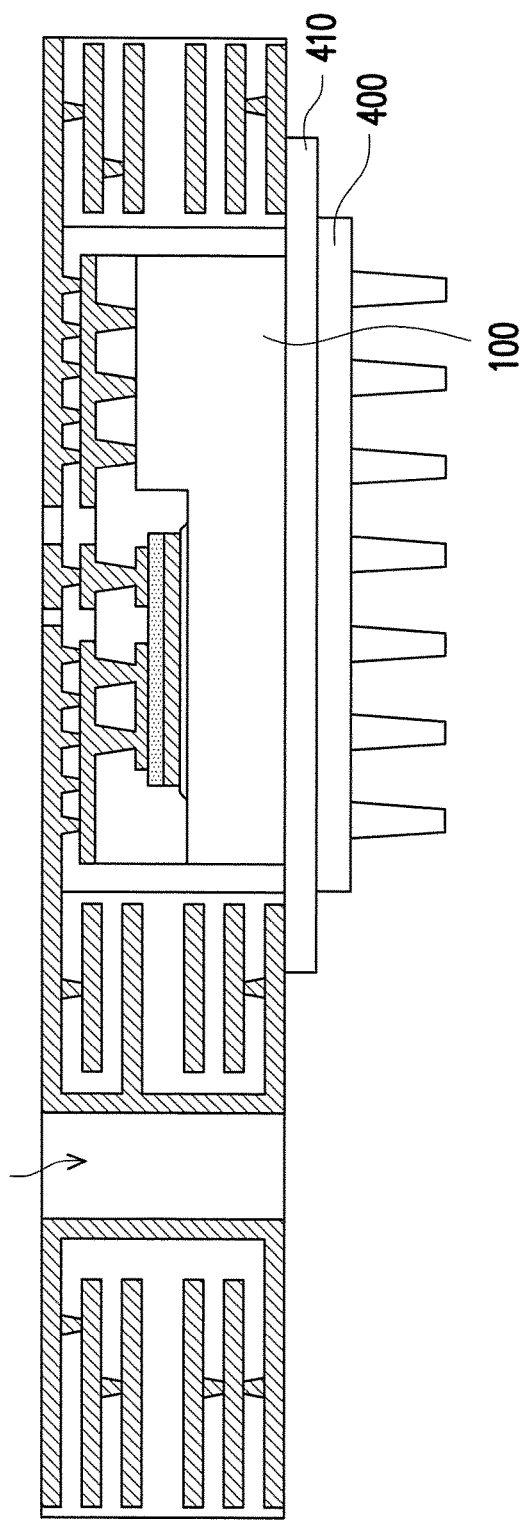
FIG. 20 is a schematic diagram illustrating a composite system board according to other embodiment of the disclosure.

FIG. 19 is a schematic diagram illustrating a composite system board according to other embodiment of the disclosure. The present embodiment is combined with the composite system board 20 as shown in FIG. 12. Referring to FIG. 12 and FIG. 20, the bottoms of the multilayer circuit board 200 and the chip packaging 10 of the composite system board 20 are exposed outside. The composite system board further includes a heat dissipation plate 600, and the heat dissipation plate 600 is covered at the bottoms of the multilayer circuit board 200 and the chip packaging 10. The heat dissipation plate 600 is connected to the multilayer circuit board 200 and the chip packaging 10 through adhesion or other appropriate means. The heat dissipation plate 600 has effects of blocking external impact, shielding and heat dissipation. effects of blocking external impact, shielding and heat dissipation. The heat dissipation plate 600 may also be considered as a ground terminal of the composite system board.

FIG. 20 is a schematic diagram illustrating a composite system board according to other embodiment of the disclosure. Referring to FIG. 20, the composite system board further includes a heat dissipation fin 400 and a second electrical insulation layer 410. The bottom surface of the substrate 100 is in a state of being exposed, and thus the heat dissipation fin 400 is disposed at the bottom surface of the substrate 100 so as to enhance the heat dissipation effect of the chip packaging 10. The second electrical insulation layer 410 is disposed between the heat dissipation fin 400 and the bottom surface of the substrate 100. Since the substrate 100 is a conductor, in order to prevent the operation of the chip packaging 10 from being influenced by unnecessary electrical contact, the second electrical insulation layer 410 is disposed on the substrate 100 to insulate external electrical contact.

The disclosure provides a chip packaging that has a high heat dissipation efficiency by adopting a copper material with huge area as the substrate or a heat dissipating structure outside the device. Through the improvement of the wiring process, holes of the chip packaging of the disclosure tend to be consistent, thereby avoiding the shortcoming due to different hole depths in the chip packaging structure. The chip packaging of the disclosure can maintain the smoothness or flatness of the wiring during the electroplating process and can produce a circuit layer with a sufficient thickness, thereby resulting in a specification with high power withstand capacity. In addition, the substrate of the chip packaging of the disclosure has a convex structure, and a second top surface is formed on the convex structure. During the press-fitting process, the second top surface can protect the chip from damage, thereby increasing a product yield of the chip packaging of the disclosure. On the other hand, since the chip packaging of the disclosure has modularizable characteristics and can be process integrated with the multilayer circuit board (such as a panel-level circuit board), the composite system board of the disclosure is more flexible in terms of production and manufacturing.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip packaging, comprising:
   a substrate, having a bottom surface and a first top surface and a second top surface opposite to the bottom surface, wherein the first top surface is disposed above the bottom surface with a first height, the second top surface is disposed above the bottom surface with a second height, and the first height is smaller than the second height;
   a first chip, disposed on the first top surface, the first chip having a first top electrode;
   a second chip, disposed on the first top surface, wherein the quantity of the substrate is plural, and the first chip and the second chip are respectively disposed on different substrates;
   a molding material, disposed on the substrate and covering the first chip, the first top surface and the second top surface;
   a first circuit, disposed on the molding material and passing through the molding material to electrically connect to the first top electrode; and
   a second circuit, disposed on the molding material and passing through the molding material to electrically connect to the second top surface of the substrate.

2. The chip packaging as recited in claim 1, wherein the first chip further has a bottom electrode, and the bottom electrode is electrically connected to the first top surface of the substrate.

3. The chip packaging as recited in claim 2, further comprising a first conductive adhesive layer disposed between the first chip and the first top surface.

4. The chip packaging as recited in claim 1, further comprising an electrical insulation layer disposed between the first chip and the first top surface.

5. The chip packaging as recited in claim 1, wherein the substrate comprises a conductor block which is integrally formed, the top of the conductor block has a depression, the first top surface is located at the bottom of the depression, and the second top surface is located outside the depression.

6. The chip packaging as recited in claim 1, wherein the substrate comprises a first conductor block which is integrally formed and a second conductor block which is integrally formed, the top of the first conductor block has the first top surface, the second conductor block is disposed at the top of the first conductor block, and the second top surface is located at the top of the second conductor block.

7. The chip packaging as recited in claim 6, further comprising a second conductive adhesive layer disposed between the second conductor block and the first conductor block.

8. The chip packaging as recited in claim 1, wherein the substrate comprises a multilayer board and a conductor block which is integrally formed, the multilayer board has a first conductive layer, a second conductive layer and a dielectric layer disposed between the first conductive layer and the second conductive layer, the first conductive layer has the first top surface, the conductor block is disposed on the first conductive layer, and the second top surface is located on the top of the conductor block.

9. The chip packaging as recited in claim 8, further comprising a second conductive adhesive layer disposed between the conductor block and the first conductive layer.

10. The chip packaging as recited in claim 1, wherein the second chip has a second top electrode and the second top electrode is electrically connected to the first top electrode through the first circuit.

11. A composite system board, comprising:
    a multilayer circuit board, having a containing hole;
    a chip packaging, disposed in the containing hole, and the chip packaging comprising:
        a substrate, having a bottom surface and a first top surface and a second top surface opposite to the bottom surface, wherein the first top surface is disposed above the bottom surface with a first height, the second top surface is disposed above the bottom surface with a second height, and the first height is smaller than the second height;
        a first chip, disposed on the first top surface, the first chip having a first top electrode;
        a second chip, disposed on the first top surface, wherein the quantity of the substrate is plural, and the first chip and the second chip are respectively disposed on different substrates;
        a molding material, disposed on the substrate and covering the first chip, the first top surface and the second top surface;
        a first circuit, disposed on the molding material and passing through the molding material to electrically connect to the first top electrode; and
        a second circuit, disposed on the molding material and passing through the molding material to electrically connect to the second top surface of the substrate;
    a first dielectric layer, covering the chip packaging and the multilayer circuit board; and
    a third circuit, disposed on the first dielectric layer and passing through the first dielectric layer to electrically connect to the first circuit or the second circuit.

12. The composite system board as recited in claim 11, further comprising a bearing member having a first groove and a second groove, and the multilayer circuit board and the chip packaging respectively disposed in the first groove and the second groove.

13. The composite system board as recited in claim 11, further comprising a first chip module embedded in the multilayer circuit board and electrically connected to the multilayer circuit board.

14. The composite system board as recited in claim 11, further comprising a second chip module disposed on the multilayer circuit board and electrically connected to the multilayer circuit board and the chip packaging.

15. The composite system board as recited in claim 11, wherein the first chip further has a bottom electrode, and the bottom electrode is electrically connected to the first top surface of the substrate.

16. The composite system board as recited in claim 15, wherein the chip packaging further comprises a first conductive adhesive layer disposed between the first chip and the first top surface.

17. The composite system board as recited in claim 11, wherein the chip packaging further comprises a first electrical insulation layer disposed between the first chip and the first top surface.

18. The composite system board as recited in claim 11, wherein the substrate comprises a conductor block which is integrally formed, the top of the conductor block has a depression, the first top surface is located at the bottom of the depression, and the second top surface is located outside the depression.

19. The composite system board as recited in claim 11, wherein the substrate comprises a first conductor block which is integrally formed and a second conductor block which is integrally formed, the top of the first conductor block has the first top surface, the second conductor block is disposed at the top of the first conductor block, and the second top surface is located at the top of the second conductor block.

20. The composite system board as recited in claim 19, wherein the chip packaging further comprises a second conductive adhesive layer disposed between the second conductor block and the first conductor block.

21. The composite system board as recited in claim 11, wherein the substrate comprises a multilayer board and a conductor block which is integrally formed, the multilayer board has a first conductive layer, a second conductive layer and a dielectric layer disposed between the first conductive layer and the second conductive layer, the first conductive layer has the first top surface, the conductor block is disposed on the first conductive layer, and the second top surface is located on the top of the conductor block.

22. The composite system board as recited in claim 21, wherein the chip packaging further comprises a second conductive adhesive layer disposed between the conductor block and the first conductive layer.

23. The composite system board as recited in claim 11, wherein the second chip has a second top electrode and the second top electrode is electrically connected to the first top electrode through the first circuit.

24. The composite system board as recited in claim 11, further comprising a heat dissipation fin, wherein the bottom surface of the substrate is exposed to the outside, and the heat dissipation fin is disposed at the bottom surface of the substrate.

25. The composite system board as recited in claim 24, further comprising a second electrical insulation layer disposed between the heat dissipation fin and the bottom surface of the substrate.

26. A chip packaging, comprising:
    a substrate, having a bottom surface and a first top surface and a second top surface opposite to the bottom surface;
    a first chip, disposed on the first top surface, the first chip having a first top electrode and a bottom electrode;
    a molding material, disposed on the substrate and covering the first chip, the first top surface and the second top surface;
    a first circuit, disposed on the molding material and passing through the molding material to electrically connect to the first top electrode;
    a second circuit, disposed on the molding material and passing through the molding material to electrically connect to the second top surface of the substrate;
    a second chip, disposed on the first top surface, wherein the second chip has a second top electrode, and the second top electrode is electrically connected to the first top electrode through the first circuit;
    a conductive adhesive layer, disposed between the first chip and the first top surface, wherein the bottom electrode of the first chip is electrically connected to the first top surface of the substrate through the conductive adhesive layer; and
    an electrical insulation layer, disposed between the second chip and the first top surface.

27. The chip packaging as recited in claim 26, wherein the quantity of the substrate is one, and the first chip and the second chip are disposed on the same substrate.

28. The chip packaging as recited in claim 26, wherein the substrate comprises a first conductor block which is integrally formed and a second conductor block which is integrally formed, the first conductor block has a texture structure disposed at the top of the first conductor block, and the second conductor block is disposed on the top of the first conductor block.

29. The chip packaging as recited in claim 26, wherein the first top surface is disposed above the bottom surface with a first height, the second top surface is disposed above the bottom surface with a second height, and the first height is smaller than the second height.

\* \* \* \* \*